United States Patent
Huang et al.

(10) Patent No.: US 11,923,874 B2
(45) Date of Patent: Mar. 5, 2024

(54) CODEBOOK COMPRESSION WITH LOSSY ENCODING FOR LOW PROBABILITY EVENTS

(71) Applicant: QUALCOMM Incorporated, San Diego, CA (US)

(72) Inventors: Yi Huang, San Diego, CA (US); Peter Gaal, San Diego, CA (US); Juan Montojo, San Diego, CA (US); Hwan Joon Kwon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 215 days.

(21) Appl. No.: 17/507,707

(22) Filed: Oct. 21, 2021

(65) Prior Publication Data
US 2022/0131553 A1 Apr. 28, 2022

Related U.S. Application Data

(60) Provisional application No. 63/104,977, filed on Oct. 23, 2020.

(51) Int. Cl.
*H03M 7/00* (2006.01)
*H03M 7/30* (2006.01)
(Continued)

(52) U.S. Cl.
CPC ....... *H03M 7/3059* (2013.01); *H03M 7/6011* (2013.01); *H04L 1/1819* (2013.01);
(Continued)

(58) Field of Classification Search
CPC . H03M 7/3059; H03M 7/6011; H04L 1/1819; H04L 5/0053; H04L 5/0055;
(Continued)

(56) References Cited

U.S. PATENT DOCUMENTS 8,831,653 B2 * 9/2014 Fattal ................. H04W 72/541
455/501
11,071,076 B2 * 7/2021 Akkarakaran .... H04W 56/0015
(Continued)

OTHER PUBLICATIONS

"3rd Generation Partnership Project, Technical Specification Group Radio Access Network, Evolved Universal Terrestrial Radio Access (E-UTRA), Physical Layer Procedures (Release 10)", 3GPP Standard, 3GPP TS 36.213, 3rd Generation Partnership Project (3GPP), Mobile Competence Centre, 650, Route Des Lucioles, F-06921 Sophia-Antipolis Cedex, France, vol. RAN WG1, No. V10.3.0, Sep. 25, 2011 (Sep. 25, 2011), pp. 1-122, XP050553950, [Retrieved on Sep. 25, 2011].

(Continued)

*Primary Examiner* — Jean B Jeanglaude
(74) *Attorney, Agent, or Firm* — Loza & Loza, LLP

(57) ABSTRACT

Aspects relate to compression of messages in a wireless communication system. For messages, such as ACK/NACK feedback in a communication system, messages having an occurrence above or below a certain number of events (e.g., ACK/NACK events) or a probability of the occurrence may (Continued)

be compressed into a single message. By compressing the messages into a single message, the overhead used to transmit such messages may be reduced.

28 Claims, 13 Drawing Sheets

(51) Int. Cl.
    *H04L 1/1812*     (2023.01)
    *H04L 5/00*     (2006.01)
    *H04W 28/06*     (2009.01)
    *H04W 72/1268*     (2023.01)
    *H04W 72/23*     (2023.01)
    *H04W 72/54*     (2023.01)

(52) U.S. Cl.
    CPC ............ *H04L 5/0053* (2013.01); *H04W 28/06* (2013.01); *H04W 72/1268* (2013.01); *H04W 72/23* (2023.01); *H04W 72/54* (2023.01)

(58) Field of Classification Search
    CPC ..... H04L 69/04; H04L 1/1861; H04L 1/1864; H04W 28/06; H04W 72/1268; H04W 72/23; H04W 72/54
    See application file for complete search history.

(56) References Cited

U.S. PATENT DOCUMENTS

| | | | |
|---|---|---|---|
| 2003/0097474 A1* | 5/2003 | Defosse | G07F 9/001 709/246 |
| 2009/0201871 A1* | 8/2009 | Sambhwani | H04W 72/20 370/329 |
| 2011/0165886 A1* | 7/2011 | Kodikara Patabandi | H04W 76/11 455/450 |
| 2011/0177835 A1* | 7/2011 | Fattal | H04W 72/541 455/501 |
| 2016/0233999 A1 | 8/2016 | Chendamarai Kannan et al. | |
| 2019/0141571 A1* | 5/2019 | Kim | H04L 69/04 |
| 2019/0335406 A1* | 10/2019 | Akkarakaran | H04L 27/261 |
| 2019/0349918 A1 | 11/2019 | Nayeb Nazar et al. | |

OTHER PUBLICATIONS

International Search Report and Written Opinion—PCT/US2021/056287—ISA/EPO—Feb. 22, 2022.

* cited by examiner

CODEBOOK COMPRESSION WITH LOSSY ENCODING FOR LOW PROBABILITY EVENTS

CROSS REFERENCE TO RELATED APPLICATIONS

This application claims priority to and the benefit of U.S. Provisional Application No. 63/104,977 filed in the U.S. Patent and Trademark Office on Oct. 23, 2020, the entire contents of which are incorporated herein by reference as if fully set forth below in its entirety and for all applicable purposes.

TECHNICAL FIELD

The technology discussed below relates generally to wireless communication networks, and more particularly, to codebook compression with lossy source encoding for low probability events, such as compression of a HARQ-ACK codebook used during higher reliability communications.

BACKGROUND

Certain events that occur in a wireless communication network such as a 5G New Radio (NR) network may occur with various degrees of probability. As an example, the probability of a non-acknowledgement (NACK) feedback being sent from a user equipment (UE) to a base station in response to a hybrid automatic repeat request (HARQ) may have a much lower probability of being sent compared with the alternative acknowledgement (ACK) feedback. Such asymmetric probability between events is particularly pronounced when utilizing enhanced mobile broadband (eMBB) and ultra-reliable low-latency communication (URLLC) in 5G systems.

BRIEF SUMMARY OF SOME EXAMPLES

The following presents a summary of one or more aspects of the present disclosure, in order to provide a basic understanding of such aspects. This summary is not an extensive overview of all contemplated features of the disclosure and is intended neither to identify key or critical elements of all aspects of the disclosure nor to delineate the scope of any or all aspects of the disclosure. Its sole purpose is to present some concepts of one or more aspects of the disclosure in a form as a prelude to the more detailed description that is presented later.

In aspects, a method for transmitting messages from a user equipment (UE) in a wireless communication system is disclosed. The method includes compressing multiple messages occurring in the wireless communication system into at least one compressed message using a compression technique based on a probability of occurrence of an event or a number of occurrences of the event, and transmitting the at least one compressed message on an uplink channel.

In other aspects, a user equipment (UE) for use in a wireless communication system is disclosed. The UE includes a wireless transceiver, a memory, and a processor communicatively coupled to the wireless transceiver and the memory. The processor is configured to compress multiple messages occurring in the wireless communication system into at least one compressed message using a compression technique based on a probability of occurrence of an event or based on a number of occurrences of the event, and transmit the at least one compressed message on an uplink channel.

According to further aspects, a method for use in a base station in a wireless communication system is disclosed. The method includes transmitting a signal to a user equipment (UE) in the wireless communication system. Further, the method includes receiving at least one compressed message on an uplink channel responsive to the signal, wherein the at least one compressed message is a compression of multiple messages to be sent by the UE in response to the signal, wherein the multiple messages that are compressed into the at least one compressed message based on a number of occurrences of an event or a probability of occurrence of the event.

Yet further, disclosed aspects include a base station for use in a wireless communication system. The base station includes a wireless transceiver, a memory, and a processor communicatively coupled to the wireless transceiver and the memory. The processor is configured to transmit a signal to a user equipment (UE) in the wireless communication system. Moreover, the processor is configured to receive at least one compressed message on an uplink channel responsive to the signal, wherein the at least one compressed message is a compression of multiple messages to be sent by the UE in response to the signal, wherein the multiple messages that are compressed into the at least one compressed message based on a number of occurrences of an event or a probability of occurrence of the event.

These and other aspects will become more fully understood upon a review of the detailed description, which follows. Other aspects, features, and embodiments will become apparent to those of ordinary skill in the art, upon reviewing the following description of specific, exemplary embodiments of in conjunction with the accompanying figures. While features may be discussed relative to certain embodiments and figures below, all embodiments can include one or more of the advantageous features discussed herein. In other words, while one or more embodiments may be discussed as having certain advantageous features, one or more of such features may also be used in accordance with the various embodiments discussed herein. In similar fashion, while exemplary embodiments may be discussed below as device, system, or method embodiments such exemplary embodiments can be implemented in various devices, systems, and methods.

DETAILED DESCRIPTION

Figure 1:
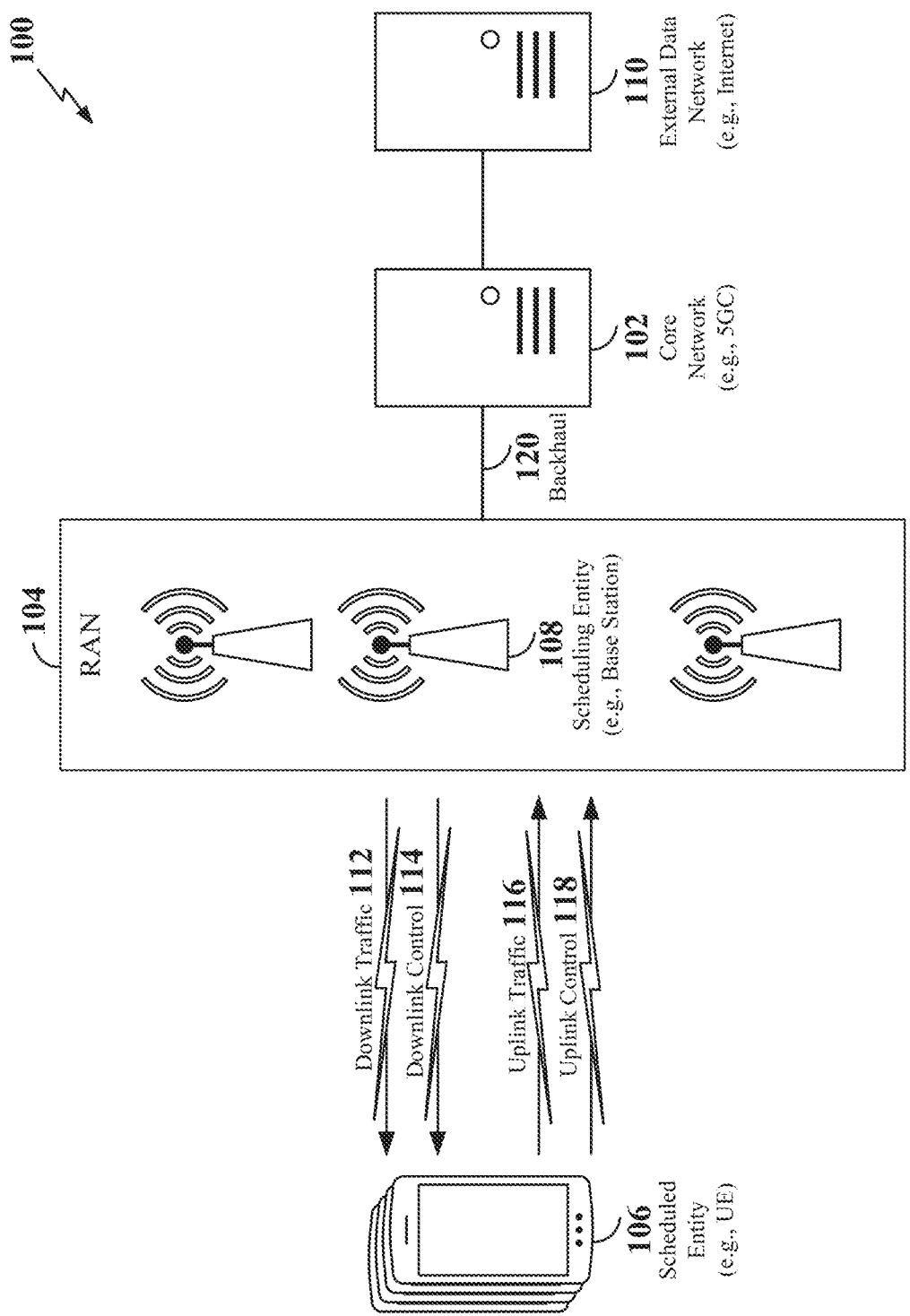
FIG. 1 is a schematic illustration of a wireless communication system according to some aspects.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

The electromagnetic spectrum is often subdivided, based on frequency/wavelength, into various classes, bands, channels, etc. In 5G NR two initial operating bands have been identified as frequency range designations FR1 (410 MHz-7.125 GHz) and FR2 (24.25 GHz-52.6 GHz). The frequencies between FR1 and FR2 are often referred to as mid-band frequencies. Although a portion of FR1 is greater than 6 GHz, FR1 is often referred to (interchangeably) as a "Sub-6 GHz" band in various documents and articles. A similar nomenclature issue sometimes occurs with regard to FR2, which is often referred to (interchangeably) as a "millimeter wave" band in documents and articles, despite being different from the extremely high frequency (EHF) band (30 GHz-300 GHz) which is identified by the International Telecommunications Union (ITU) as a "millimeter wave" band.

With the above aspects in mind, unless specifically stated otherwise, it should be understood that the term "sub-6 GHz" or the like if used herein may broadly represent frequencies that may be less than 6 GHz, may be within FR1, or may include mid-band frequencies. Further, unless specifically stated otherwise, it should be understood that the term "millimeter wave" or the like if used herein may broadly represent frequencies that may include mid-band frequencies, may be within FR2, or may be within the EHF band.

While aspects and embodiments are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, embodiments and/or uses may come about via integrated chip embodiments and other non-module-component based devices (e.g., end-user devices, vehicles, communication devices, computing devices, industrial equipment, retail/purchasing devices, medical devices, AI-enabled devices, etc.). While some examples may or may not be specifically directed to use cases or applications, a wide assortment of applicability of described innovations may occur. Implementations may range in spectrum from chip-level or modular components to non-modular, non-chip-level implementations and further to aggregate, distributed, or Original Equipment Manufacturer (OEM) devices or systems incorporating one or more aspects of the described innovations. In some practical settings, devices incorporating described aspects and features may also necessarily include additional components and features for implementation and practice of claimed and described embodiments. For example, transmission and reception of wireless signals necessarily includes a number of components for analog and digital purposes (e.g., hardware components including antenna, RF-chains, power amplifiers, modulators, buffer, processor (s), interleaver, adders/summers, etc.). It is intended that innovations described herein may be practiced in a wide variety of devices, chip-level components, systems, distributed arrangements, end-user devices, etc. of varying sizes, shapes and constitution.

Various aspects of this disclosure relate to methods and apparatus that more efficiently accounts for asymmetric probabilities, such as the differences in probabilities of a non-acknowledgement (NACK) feedback being sent from a user equipment (UE) to a base station in response to a hybrid automatic repeat request (HARQ) verses acknowledgement (ACK) feedback. Recognizing the rarity of certain events such as NACK feedback in URLLC systems, for example, the present disclosure provides for compression of signaling of such events. Compressing signaling bits to account for rare events serves to reduce payload size of transmissions and overhead processing. In a particular aspect, the compression provides for compressing multiple messages into a single message.

The various concepts presented throughout this disclosure may be implemented across a broad variety of telecommunication systems, network architectures, and communication standards. Referring now to FIG. 1, as an illustrative example without limitation, various aspects of the present disclosure are illustrated with reference to a wireless communication system 100. The wireless communication system 100 includes three interacting domains: a core network 102, a radio access network (RAN) 104, and at least one scheduled entity 106. The at least one scheduled entity 106 may be referred to as a user equipment (UE) 106 in the discussion that follows. The RAN 104 includes at least one scheduling entity 108. The at least one scheduling entity 108 may be referred to as a base station (BS) 108 in the discussion that follows. By virtue of the wireless communication system 100, the UE 106 may be enabled to carry out data communication with an external data network 110, such as (but not limited to) the Internet.

The RAN 104 may implement any suitable wireless communication technology or technologies to provide radio access to the UE 106. As one example, the RAN 104 may operate according to 3rd Generation Partnership Project (3GPP) New Radio (NR) specifications, often referred to as 5G. As another example, the RAN 104 may operate under a hybrid of 5G NR and Evolved Universal Terrestrial Radio Access Network (eUTRAN) standards, often referred to as LTE. The 3GPP refers to this hybrid RAN as a next-generation RAN, or NG-RAN. Of course, many other examples may be utilized within the scope of the present disclosure.

As illustrated, the RAN 104 includes a plurality of base stations 108. Broadly, a base station is a network element in a radio access network responsible for radio transmission and reception in one or more cells to or from a UE. In different technologies, standards, or contexts, a base station may variously be referred to by those skilled in the art as a base transceiver station (BTS), a radio base station, a radio transceiver, a transceiver function, a basic service set (BSS), an extended service set (ESS), an access point (AP), a Node B (NB), an eNode B (eNB), a gNode B (gNB), a network access node, a transmission and reception point (TRP) or some other suitable terminology. In some examples, a base station may include two or more TRPs that may be co-located or non-co-located. Each TRP may communicate on the same or different carrier frequency within the same or different frequency band.

The radio access network 104 is further illustrated supporting wireless communication for multiple mobile apparatuses. A mobile apparatus may be referred to as user equipment (UE) in 3GPP standards, but may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology. A UE may be an apparatus that provides a user with access to network services.

Within the present document, a "mobile" apparatus need not necessarily have a capability to move, and may be stationary. The term mobile apparatus or mobile device broadly refers to a diverse array of devices and technologies. UEs may include a number of hardware structural components sized, shaped, and arranged to help in communication; such components can include antennas, antenna arrays, radio frequency (RF) chains, amplifiers, one or more processors, etc. electrically coupled to each other. For example, some non-limiting examples of a mobile apparatus include a mobile, a cellular (cell) phone, a smart phone, a session initiation protocol (SIP) phone, a laptop, a personal computer (PC), a notebook, a netbook, a smartbook, a tablet, a personal digital assistant (PDA), and a broad array of embedded systems, e.g., corresponding to an "Internet of Things" (IoT). A mobile apparatus may additionally be an automotive or other transportation vehicle, a remote sensor or actuator, a robot or robotics device, a satellite radio, a global positioning system (GPS) device, an object tracking device, a drone, a multi-copter, a quad-copter, a remote control device, a consumer and/or wearable device, such as eyewear, a wearable camera, a virtual reality device, a smart watch, a health or fitness tracker, a digital audio player (e.g., MP3 player), a camera, a game console, etc. A mobile apparatus may additionally be a digital home or smart home device such as a home audio, video, and/or multimedia device, an appliance, a vending machine, intelligent lighting, a home security system, a smart meter, etc. A mobile apparatus may additionally be a smart energy device, a security device, a solar panel or solar array, a municipal infrastructure device controlling electric power (e.g., a smart grid), lighting, water, an industrial automation and enterprise device, a logistics controller, etc. Still further, a mobile apparatus may provide for connected medicine or telemedicine support, i.e., health care at a distance. Telehealth devices may include telehealth monitoring devices and telehealth administration devices, whose communication may be given preferential treatment or prioritized access over other types of information, e.g., in terms of prioritized access for transport of critical service data, and/or relevant QoS for transport of critical service data.

Wireless communication between a RAN 104 and a UE 106 may be described as utilizing an air interface. Transmissions over the air interface from a base station (e.g., base station 108) to one or more UEs (e.g., UE 106) may be referred to as downlink (DL) transmission. In accordance with certain aspects of the present disclosure, the term downlink may refer to a point-to-multipoint transmission originating at a scheduling entity (described further below; e.g., base station 108). Another way to describe this scheme may be to use the term broadcast channel multiplexing. Transmissions from a UE (e.g., UE 106) to a base station (e.g., base station 108) may be referred to as uplink (UL) transmissions. In accordance with further aspects of the present disclosure, the term uplink may refer to a point-to-point transmission originating at a scheduled entity (described further below; e.g., UE 106).

In some examples, access to the air interface may be scheduled, wherein a scheduling entity (e.g., a base station 108) allocates resources for communication among some or all devices and equipment within its service area or cell. Within the present disclosure, as discussed further below, the scheduling entity may be responsible for scheduling, assigning, reconfiguring, and releasing resources for one or more scheduled entities. That is, for scheduled communication, UEs 106, which may be scheduled entities, may utilize resources allocated by the scheduling entity 108.

Base stations 108 are not the only entities that may function as scheduling entities. That is, in some examples, a UE may function as a scheduling entity, scheduling resources for one or more scheduled entities (e.g., one or more other UEs). And as discussed more below, UEs may communicate directly with other UEs in peer-to-peer fashion and/or in relay configuration.

As illustrated in FIG. 1, a scheduling entity 108 may broadcast downlink traffic 112 to one or more scheduled entities 106. Broadly, the scheduling entity 108 is a node or device responsible for scheduling traffic in a wireless communication network, including the downlink traffic 112 and, in some examples, uplink traffic 116 from one or more scheduled entities 106 to the scheduling entity 108. On the other hand, the scheduled entity 106 is a node or device that receives downlink control information 114, including but not limited to scheduling information (e.g., a grant), synchronization or timing information, or other control information from another entity in the wireless communication network such as the scheduling entity 108.

In addition, the uplink and/or downlink control information and/or traffic information may be time-divided into frames, subframes, slots, and/or symbols. As used herein, a symbol may refer to a unit of time that, in an orthogonal frequency division multiplexed (OFDM) waveform, carries one resource element (RE) per sub-carrier. A slot may carry 7 or 14 OFDM symbols. A subframe may refer to a duration of 1 ms. Multiple subframes or slots may be grouped together to form a single frame or radio frame. Of course, these definitions are not required, and any suitable scheme for organizing waveforms may be utilized, and various time divisions of the waveform may have any suitable duration.

In general, base stations 108 may include a backhaul interface for communication with a backhaul portion 120 of the wireless communication system. The backhaul 120 may provide a link between a base station 108 and the core network 102. Further, in some examples, a backhaul network may provide interconnection between the respective base stations 108. Various types of backhaul interfaces may be employed, such as a direct physical connection, a virtual network, or the like using any suitable transport network.

The core network 102 may be a part of the wireless communication system 100, and may be independent of the radio access technology used in the RAN 104. In some examples, the core network 102 may be configured according to 5G standards (e.g., 5GC). In other examples, the core network 102 may be configured according to a 4G evolved packet core (EPC), or any other suitable standard or configuration.

Figure 2:
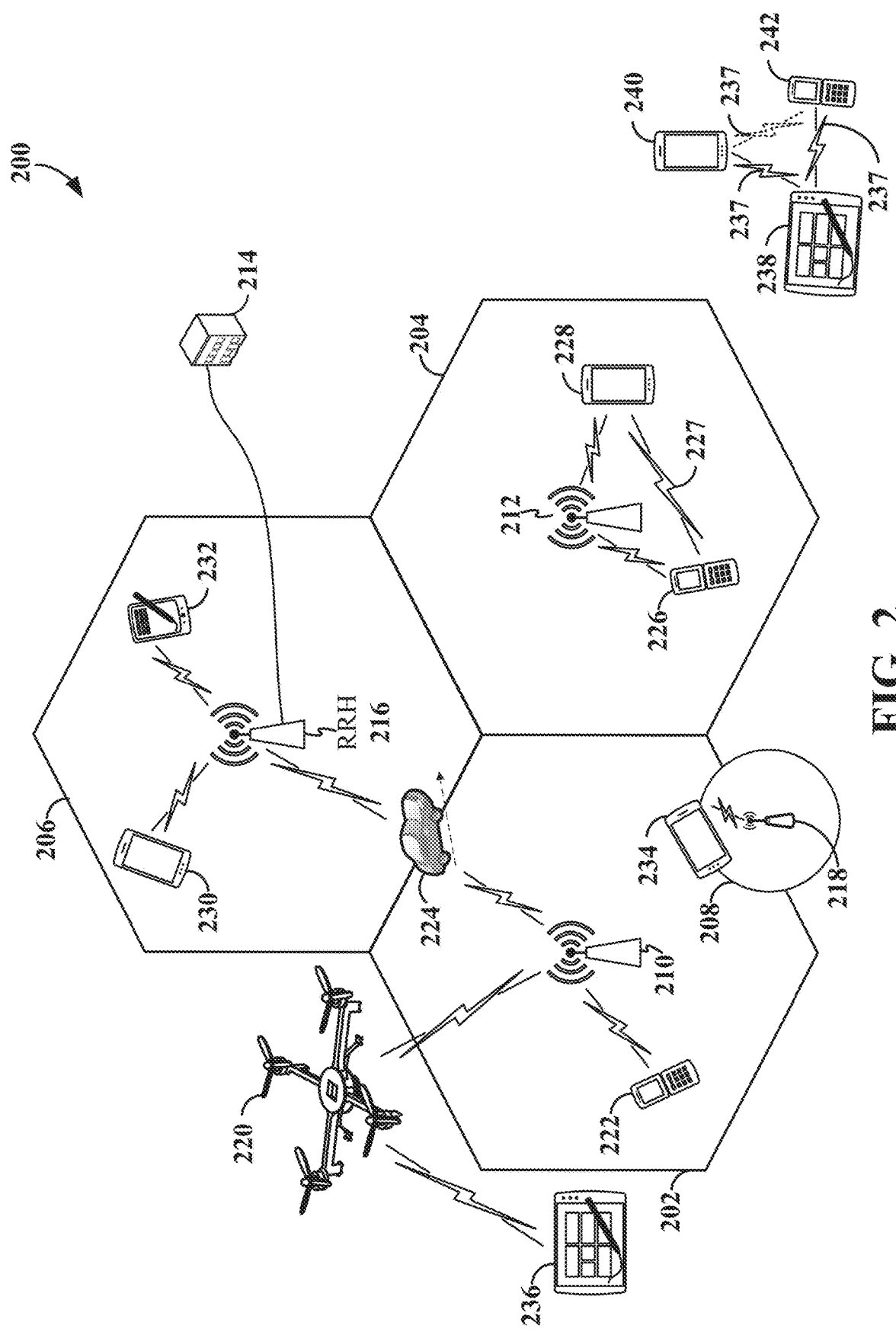
FIG. 2 is a conceptual illustration of an example of a radio access network according to some aspects.

Referring now to FIG. 2, by way of example and without limitation, an illustration of a RAN 200 is provided. The RAN 200 may implement any suitable wireless communication technology or technologies to provide radio access. As one example, the RAN 200 may operate according to 3rd Generation Partnership Project (3GPP) New Radio (NR) specifications, often referred to as 5G. As another example, the RAN 200 may operate under a hybrid of 5G NR and Evolved Universal Terrestrial Radio Access Network (eUTRAN) standards, often referred to as LTE. The 3GPP refers to this hybrid RAN as a next-generation RAN, or NG-RAN. Of course, many other examples may be utilized within the scope of the present disclosure.

The geographic region covered by the radio access network 200 may be divided into a number of cellular regions (cells) that can be uniquely identified by a user equipment (UE) based on an identification broadcasted over a geographical area from one access point or base station. FIG. 2 illustrates cells 202, 204, 206, and cell 208, each of which may include one or more sectors (not shown). A sector is a sub-area of a cell. All sectors within one cell are served by the same base station. A radio link within a sector can be identified by a single logical identification belonging to that sector. In a cell that is divided into sectors, the multiple sectors within a cell can be formed by groups of antennas with each antenna responsible for communication with UEs in a portion of the cell.

In general, a respective base station (BS) serves each cell. Broadly, a base station is a network element in a radio access network responsible for radio transmission and reception in one or more cells to or from a UE. A BS may also be referred to by those skilled in the art as a base transceiver station (BTS), a radio base station, a radio transceiver, a transceiver function, a basic service set (BSS), an extended service set (ESS), an access point (AP), a Node B (NB), an eNode B (eNB), a gNode B (gNB), a transmission and reception point (TRP), or some other suitable terminology. In some examples, a base station may include two or more TRPs that may be collocated or non-collocated. Each TRP may communicate on the same or different carrier frequency within the same or different frequency band. In examples where the RAN 200 operates according to both the LTE and 5G NR standards, one of the base stations may be an LTE base station, while another base station may be a 5G NR base station.

Various base station arrangements can be utilized. For example, in FIG. 2, two base stations 210 and 212 are shown in cells 202 and 204; and a third base station 214 is shown controlling a remote radio head (RRH) 216 in cell 206. That is, a base station can have an integrated antenna or can be connected to an antenna or RRH by feeder cables. In the illustrated example, the cells 202, 204, and 206 may be referred to as macrocells, as the base stations 210, 212, and 214 support cells having a large size. Further, a base station 218 is shown in the cell 208 which may overlap with one or more macrocells. In this example, the cell 208 may be referred to as a small cell (e.g., a microcell, picocell, femtocell, home base station, home Node B, home eNode B, etc.), as the base station 218 supports a cell having a relatively small size. Cell sizing can be done according to system design as well as component constraints.

It is to be understood that the radio access network 200 may include any number of wireless base stations and cells. Further, a relay node may be deployed to extend the size or coverage area of a given cell. The base stations 210, 212, 214, 218 provide wireless access points to a core network for any number of mobile apparatuses.

FIG. 2 further includes an unmanned aerial vehicle (UAV) 220, which may be a drone or quadcopter. The UAV 220 may be configured to function as a base station, or more specifically as a mobile base station. That is, in some examples, a cell may not necessarily be stationary, and the geographic area of the cell may move according to the location of a mobile base station such as the UAV 220.

In general, base stations may include a backhaul interface for communication with a backhaul portion (not shown) of the network. The backhaul may provide a link between a base station and a core network (not shown), and in some examples, the backhaul may provide interconnection between the respective base stations. The core network may be a part of a wireless communication system and may be independent of the radio access technology used in the radio access network. Various types of backhaul interfaces may be employed, such as a direct physical connection, a virtual network, or the like using any suitable transport network.

The RAN 200 is illustrated supporting wireless communication for multiple mobile apparatuses. A mobile apparatus is commonly referred to as user equipment (UE) in standards and specifications promulgated by the 3rd Generation Partnership Project (3GPP), but may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology. A UE may be an apparatus that provides a user with access to network services.

For purposes of the present application, a "mobile" apparatus need not necessarily have a capability to move, and may be stationary. The term mobile apparatus or mobile device broadly refers to a diverse array of devices and technologies. For example, some non-limiting examples of a mobile apparatus include a mobile, a cellular (cell) phone, a smart phone, a session initiation protocol (SIP) phone, a laptop, a personal computer (PC), a notebook, a netbook, a smartbook, a tablet, a personal digital assistant (PDA), and a broad array of embedded systems, e.g., corresponding to an "Internet of things" (IoT). A mobile apparatus may additionally be an automotive or other transportation vehicle, a remote sensor or actuator, a robot or robotics device, a satellite radio, a global positioning system (GPS) device, an object tracking device, a drone, a multi-copter, a quad-copter, a remote control device, a consumer and/or wearable device, such as eyewear, a wearable camera, a virtual reality device, a smart watch, a health or fitness tracker, a digital audio player (e.g., MP3 player), a camera, a game console, etc. A mobile apparatus may additionally be a digital home or smart home device such as a home audio, video, and/or multimedia device, an appliance, a vending machine, intelligent lighting, a home security system, a smart meter, etc. A mobile apparatus may additionally be a smart energy device, a security device, a solar panel or solar array, a municipal infrastructure device controlling electric power (e.g., a smart grid), lighting, water, etc., an industrial automation and enterprise device, a logistics controller, etc. Still further, a mobile apparatus may provide for connected medicine or telemedicine support, i.e., health care at a distance. Telehealth devices may include telehealth monitoring devices and telehealth administration devices, whose communication may be given preferential treatment or prioritized access over other types of information, e.g., in terms of prioritized access for transport of critical service data, and/or relevant QoS for transport of critical service data.

Within the RAN 200, the cells may include UEs that may be in communication with one or more sectors of each cell. For example, UEs 222 and 224 may be in communication with base station 210; UEs 226 and 228 may be in communication with base station 212; UEs 230 and 232 may be in communication with base station 214 by way of RRH 216; UE 234 may be in communication with base station 218; and UE 236 may be in communication with mobile base station 220. Here, each base station 210, 212, 214, 218, and 220 may be configured to provide an access point to a core network (not shown) for all the UEs in the respective cells. In some examples, the UAV 220 (e.g., the quadcopter) can be a mobile network node and may be configured to function as a UE. For example, the UAV 220 may operate within cell 202 by communicating with base station 210.

Wireless communication between a RAN 200 and a UE (e.g., UE 222 or 224) may be described as utilizing an air interface. Transmissions over the air interface from a base station (e.g., base station 210) to one or more UEs (e.g., UE 222 and 224) may be referred to as downlink (DL) transmission. In accordance with certain aspects of the present disclosure, the term downlink may refer to a point-to-multipoint transmission originating at a scheduling entity (described further below; e.g., base station 210). Another way to describe this scheme may be to use the term broadcast channel multiplexing. Transmissions from a UE (e.g., UE 222) to a base station (e.g., base station 210) may be referred to as uplink (UL) transmissions. In accordance with further aspects of the present disclosure, the term uplink may refer to a point-to-point transmission originating at a scheduled entity (described further below; e.g., UE 222).

For example, DL transmissions may include unicast or broadcast transmissions of control information and/or traffic information (e.g., user data traffic) from a base station (e.g., base station 210) to one or more UEs (e.g., UEs 222 and 224), while UL transmissions may include transmissions of control information and/or traffic information originating at a UE (e.g., UE 222). In addition, the uplink and/or downlink control information and/or traffic information may be time-divided into frames, subframes, slots, and/or symbols. As used herein, a symbol may refer to a unit of time that, in an orthogonal frequency division multiplexed (OFDM) waveform, carries one resource element (RE) per sub-carrier. A slot may carry 7 or 14 OFDM symbols. A subframe may refer to a duration of 1 ms. Multiple subframes or slots may be grouped together to form a single frame or radio frame. Within the present disclosure, a frame may refer to a predetermined duration (e.g., 10 ms) for wireless transmissions, with each frame consisting of, for example, 10 subframes of 1 ms each. Of course, these definitions are not required, and any suitable scheme for organizing waveforms may be utilized, and various time divisions of the waveform may have any suitable duration.

In some examples, access to the air interface may be scheduled, wherein a scheduling entity (e.g., a base station) allocates resources (e.g., time-frequency resources) for communication among some or all devices and equipment within its service area or cell. Within the present disclosure, as discussed further below, the scheduling entity may be responsible for scheduling, assigning, reconfiguring, and releasing resources for one or more scheduled entities. That is, for scheduled communication, UEs or scheduled entities utilize resources allocated by the scheduling entity.

Base stations are not the only entities that may function as a scheduling entity. That is, in some examples, a UE may function as a scheduling entity, scheduling resources for one or more scheduled entities (e.g., one or more other UEs). For example, two or more UEs (e.g., UEs 238, 240, and 242) may communicate with each other using sidelink signals 237 without relaying that communication through a base station. In some examples, the UEs 238, 240, and 242 may each function as a scheduling entity or transmitting sidelink device and/or a scheduled entity or a receiving sidelink device to schedule resources and communicate sidelink signals 237 therebetween without relying on scheduling or control information from a base station. In other examples, two or more UEs (e.g., UEs 226 and 228) within the coverage area of a base station (e.g., base station 212) may also communicate sidelink signals 227 over a direct link (sidelink) without conveying that communication through the base station 212. In this example, the base station 212 may allocate resources to the UEs 226 and 228 for the sidelink communication. In either case, such sidelink signaling 227 and 237 may be implemented in a peer-to-peer (P2P) network, a device-to-device (D2D) network, a vehicle-to-vehicle (V2V) network, a vehicle-to-everything (V2X) network, a mesh network, or other suitable direct link network.

In some examples, a D2D relay framework may be included within a cellular network to facilitate relaying of communication to/from the base station 212 via D2D links (e.g., sidelinks 227 or 237). For example, one or more UEs (e.g., UE 228) within the coverage area of the base station 212 may operate as relaying UEs to extend the coverage of the base station 212, improve the transmission reliability to one or more UEs (e.g., UE 226), and/or to allow the base station to recover from a failed UE link due to, for example, blockage or fading.

Two primary technologies that may be used by V2X networks include dedicated short range communication (DSRC) based on Institute of Electrical and Electronics Engineers (IEEE) 802.11p standards and cellular V2X based on LTE and/or 5G (New Radio) standards. Various aspects of the present disclosure may relate to New Radio (NR) cellular V2X networks, referred to herein as V2X networks, for simplicity. However, it should be understood that the concepts disclosed herein may not be limited to a particular V2X standard or may be directed to sidelink networks other than V2X networks.

In another example of sidelink communication, a cell 250 includes a base station, gNB, or RRH 252. Additionally, a UE 254 and UE 256 may be configured to communicate via a UE-to-UE relay device 258 that wirelessly links the UEs 254 and 256. In an example, the UE-to-UE relay device 258 may be a UE or similar mobile device. The UE-to-UE relay 258 is wirelessly linked via sidelink signaling 260 and 262, which may be a PC5 link or similar link.

In order for transmissions over the air interface to obtain a low block error rate (BLER) while still achieving very high data rates, channel coding may be used. That is, wireless communication may generally utilize a suitable error correcting block code. In a typical block code, an information message or sequence is split up into code blocks (CBs), and an encoder (e.g., a CODEC) at the transmitting device then mathematically adds redundancy to the information message. Exploitation of this redundancy in the encoded information message can improve the reliability of the message, enabling correction for any bit errors that may occur due to the noise.

Data coding may be implemented in multiple manners. In early 5G NR specifications, user data is coded using quasi-cyclic low-density parity check (LDPC) with two different base graphs: one base graph is used for large code blocks and/or high code rates, while the other base graph is used otherwise. Control information and the physical broadcast channel (PBCH) are coded using Polar coding, based on nested sequences. For these channels, puncturing, shortening, and repetition are used for rate matching.

Aspects of the present disclosure may be implemented utilizing any suitable channel code. Various implementations of base stations and UEs may include suitable hardware and capabilities (e.g., an encoder, a decoder, and/or a CODEC) to utilize one or more of these channel codes for wireless communication.

In the RAN 200, the ability for a UE to communicate while moving, independent of their location, is referred to as mobility. The various physical channels between the UE and the RAN are generally set up, maintained, and released under the control of an access and mobility management function (AMF). In some scenarios, the AMF may include a security context management function (SCMF) and a security anchor function (SEAF) that performs authentication. The SCMF can manage, in whole or in part, the security context for both the control plane and the user plane functionality.

In some examples, a RAN 200 may enable mobility and handovers (i.e., the transfer of a UE's connection from one radio channel to another). For example, during a call with a scheduling entity, or at any other time, a UE may monitor various parameters of the signal from its serving cell as well as various parameters of neighboring cells. Depending on the quality of these parameters, the UE may maintain communication with one or more of the neighboring cells. During this time, if the UE moves from one cell to another, or if signal quality from a neighboring cell exceeds that from the serving cell for a given amount of time, the UE may undertake a handoff or handover from the serving cell to the neighboring (target) cell. For example, UE 224 may move from the geographic area corresponding to its serving cell 202 to the geographic area corresponding to a neighbor cell 206. When the signal strength or quality from the neighbor cell 206 exceeds that of its serving cell 202 for a given amount of time, the UE 224 may transmit a reporting message to its serving base station 210 indicating this condition. In response, the UE 224 may receive a handover command, and the UE may undergo a handover to the cell 206.

In various implementations, the air interface in the RAN 200 may utilize licensed spectrum, unlicensed spectrum, or shared spectrum. Licensed spectrum provides for exclusive use of a portion of the spectrum, generally by virtue of a mobile network operator purchasing a license from a government regulatory body. Unlicensed spectrum provides for shared use of a portion of the spectrum without need for a government-granted license. While compliance with some technical rules is generally still required to access unlicensed spectrum, generally, any operator or device may gain access. Shared spectrum may fall between licensed and unlicensed spectrum, wherein technical rules or limitations may be required to access the spectrum, but the spectrum may still be shared by multiple operators and/or multiple RATs. For example, the holder of a license for a portion of licensed spectrum may provide licensed shared access (LSA) to share that spectrum with other parties, e.g., with suitable licensee-determined conditions to gain access.

The air interface in the RAN 200 may utilize one or more multiplexing and multiple access algorithms to enable simultaneous communication of the various devices. For example, 5G NR specifications provide multiple access for UL or reverse link transmissions from UEs 222 and 224 to base station 210, and for multiplexing DL or forward link transmissions from the base station 210 to UEs 222 and 224 utilizing orthogonal frequency division multiplexing (OFDM) with a cyclic prefix (CP). In addition, for UL transmissions, 5G NR specifications provide support for discrete Fourier transform-spread-OFDM (DFT-s-OFDM) with a CP (also referred to as single-carrier FDMA (SC-FDMA)). However, within the scope of the present disclosure, multiplexing and multiple access are not limited to the above schemes, and may be provided utilizing time division multiple access (TDMA), code division multiple access (CDMA), frequency division multiple access (FDMA), sparse code multiple access (SCMA), resource spread multiple access (RSMA), or other suitable multiple access schemes. Further, multiplexing DL transmissions from the base station 210 to UEs 222 and 224 may be provided utilizing time division multiplexing (TDM), code division multiplexing (CDM), frequency division multiplexing (FDM), orthogonal frequency division multiplexing (OFDM), sparse code multiplexing (SCM), or other suitable multiplexing schemes.

Further, the air interface in the RAN 100 may utilize one or more duplexing algorithms. Duplex refers to a point-to-point communication link where both endpoints can communicate with one another in both directions. Full-duplex means both endpoints can simultaneously communicate with one another. Half-duplex means only one endpoint can send information to the other at a time. Half-duplex emulation is frequently implemented for wireless links utilizing time division duplex (TDD). In TDD, transmissions in different directions on a given channel are separated from one another using time division multiplexing. That is, at some times the channel is dedicated for transmissions in one direction, while at other times the channel is dedicated for transmissions in the other direction, where the direction may change very rapidly, e.g., several times per slot. In a wireless link, a full-duplex channel generally relies on physical isolation of a transmitter and receiver, and suitable interference cancellation technologies. Full-duplex emulation is frequently implemented for wireless links by utilizing frequency division duplex (FDD) or spatial division duplex (SDD). In FDD, transmissions in different directions may operate at different carrier frequencies (e.g., within paired spectrum). In SDD, transmissions in different directions on a given channel are separated from one another using spatial division multiplexing (SDM). In other examples, full-duplex communication may be implemented within unpaired spectrum (e.g., within a single carrier bandwidth), where transmissions in different directions occur within different sub-bands of the carrier bandwidth. This type of full-duplex communication may be referred to herein as sub-band full duplex (SBFD), also known as flexible duplex.

Various aspects of the present disclosure will be described with reference to an OFDM waveform, schematically illustrated in FIG. 3. It should be understood by those of ordinary skill in the art that the various aspects of the present disclosure may be applied to an SC-FDMA waveform in substantially the same way as described herein below. That is, while some examples of the present disclosure may focus on an OFDM link for clarity, it should be understood that the same principles may be applied as well to SC-FDMA waveforms.

Figure 3:
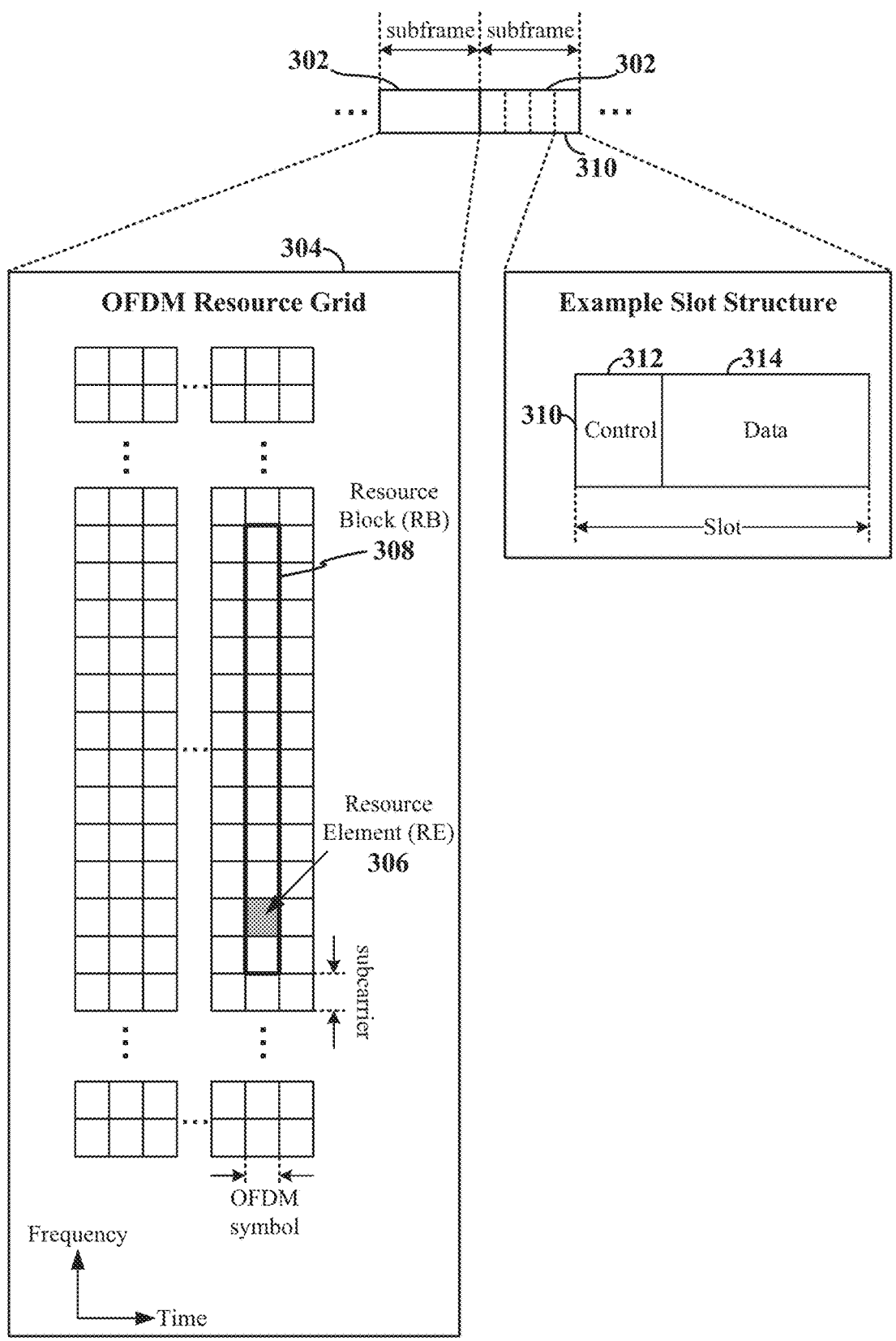
FIG. 3 is a diagram illustrating an example of a frame structure for use in a radio access network according to some aspects.

Referring now to FIG. 3, an expanded view of an example DL subframe 302 is illustrated, showing an OFDM resource grid. However, as those skilled in the art will readily appreciate, the physical layer (PHY) transmission structure for any particular application may vary from the example described here, depending on any number of factors. Here, time is in the horizontal direction with units of OFDM symbols; and frequency is in the vertical direction with units of subcarriers.

The resource grid 304 may be used to schematically represent time-frequency resources for a given antenna port. That is, in a multiple-input-multiple-output (MIMO) implementation with multiple antenna ports available, a corresponding multiple number of resource grids 304 may be available for communication. The resource grid 304 is divided into multiple resource elements (REs) 306. An RE, which is 1 subcarrier×1 symbol, is the smallest discrete part of the time-frequency grid, and contains a single complex value representing data from a physical channel or signal. Depending on the modulation utilized in a particular implementation, each RE may represent one or more bits of information. In some examples, a block of REs may be referred to as a physical resource block (PRB) or a resource block (RB) 308, which contains any suitable number of consecutive subcarriers in the frequency domain. In one example, an RB may include 12 subcarriers, a number independent of the numerology used. In some examples, depending on the numerology, an RB may include any suitable number of consecutive OFDM symbols in the time domain Within the present disclosure, it is assumed that a single RB such as the RB 308 entirely corresponds to a single direction of communication (either transmission or reception for a given device).

Scheduling of UEs (e.g., scheduled entities) for downlink or uplink transmissions typically involves scheduling one or more resource elements 306 within one or more sub-bands. Thus, a UE generally utilizes only a subset of the resource grid 304. In some examples, an RB may be the smallest unit of resources that can be allocated to a UE. Thus, the more RBs scheduled for a UE, and the higher the modulation scheme chosen for the air interface, the higher the data rate for the UE.

In this illustration, the RB 308 is shown as occupying less than the entire bandwidth of the subframe 302, with some subcarriers illustrated above and below the RB 308. In a given implementation, the subframe 302 may have a bandwidth corresponding to any number of one or more RBs 308. Further, in this illustration, the RB 308 is shown as occupying less than the entire duration of the subframe 302, although this is merely one possible example.

Each 1 ms subframe 302 may consist of one or multiple adjacent slots. In the example shown in FIG. 3, one subframe 302 includes four slots 310, as an illustrative example. In some examples, a slot may be defined according to a specified number of OFDM symbols with a given cyclic prefix (CP) length. For example, a slot may include 7 or 14 OFDM symbols with a nominal CP. Additional examples may include mini-slots, sometimes referred to as shortened transmission time intervals (TTIs), having a shorter duration (e.g., one to three OFDM symbols). These mini-slots or shortened transmission time intervals (TTIs) may in some cases be transmitted occupying resources scheduled for ongoing slot transmissions for the same or for different UEs. Any number of resource blocks may be utilized within a subframe or slot.

An expanded view of one of the slots 310 illustrates the slot 310 including a control region 312 and a data region 314. In general, the control region 312 may carry control channels, and the data region 314 may carry data channels. Of course, a slot may contain all DL, all UL, or at least one DL portion and at least one UL portion. The structure illustrated in FIG. 3 is an example, and different slot structures may be utilized, and may include one or more of each of the control region(s) and data region(s).

Although not illustrated in FIG. 3, the various REs 306 within a RB 308 may be scheduled to carry one or more physical channels, including control channels, shared channels, data channels, etc. Other REs 306 within the RB 308 may also carry pilots or reference signals, including but not limited to a demodulation reference signal (DMRS), a control reference signal (CRS), or a sounding reference signal (SRS). These pilots or reference signals may provide for a receiving device to perform channel estimation of the corresponding channel, which may enable coherent demodulation/detection of the control and/or data channels within the RB 308.

In a DL transmission, the transmitting device (e.g., the scheduling entity) may allocate one or more REs 306 (e.g., within a control region 312) to carry DL control information including one or more DL control channels, such as a PBCH and/or a physical downlink control channel (PDCCH), etc., to one or more scheduled entities. The PDCCH carries downlink control information (DCI) including but not limited to power control commands, scheduling information, a grant, and/or an assignment of REs for DL and UL transmissions. The transmitting device may further allocate one or more REs 306 to carry other DL signals, such as a DMRS; a phase-tracking reference signal (PT-RS); a channel state information-reference signal (CSI-RS); a primary synchronization signal (PSS); and a secondary synchronization signal (SSS). A UE may utilize the PSS and SSS to achieve radio frame, subframe, slot, and symbol synchronization in the time domain, identify the center of the channel (system) bandwidth in the frequency domain, and identify the physical cell identity (PCI) of the cell.

The synchronization signals PSS and SSS, and in some examples, the PBCH and a PBCH DMRS, may be transmitted in a synchronization signal block (SSB) that includes 4 consecutive OFDM symbols, numbered via a time index in increasing order from 0 to 4. In the frequency domain, the SSB may extend over 240 contiguous subcarriers, with the subcarriers being numbered via a frequency index in increasing order from 0 to 249. Of course, the present disclosure is not limited to this specific SSB configuration. Other non-limiting examples may utilize greater or fewer than two synchronization signals; may include one or more supplemental channels in addition to the PBCH; may omit a PBCH; and/or may utilize a different number of symbols/frequencies and/or nonconsecutive symbols/frequencies for an SSB, within the scope of the present disclosure.

The PBCH may further include a master information block (MIB) that includes various system information, along with parameters for decoding a system information block (SIB). The SIB may be, for example, a SystemInformation-Type 1 (SIB1) that may include various additional system information. Examples of system information transmitted in the MIB may include, but are not limited to, a subcarrier spacing, system frame number, a configuration of a PDCCH control resource set (CORESET) (e.g., PDCCH CORE-SET0), and a search space for SIB1. Examples of additional system information transmitted in the SIB1 may include, but are not limited to, a random access search space, downlink configuration information, and uplink configuration information. The MIB and SIB1 together provide the minimum system information (SI) for initial access.

As discussed above, a BS may transmit synchronization signals (e.g., including PSS and SSS) in the network to enable UEs to synchronize with the BS, as well as SI (e.g., including a Master Information Block (MIB), Remaining Minimum System Information (RMSI), and Other System Information (OSI)) to facilitate initial network access. The BS may transmit the PSS, the SSS, and/or the MIB via SSBs over PBCH and may broadcast the RMSI and/or the OSI over the PDSCH.

A UE attempting to access the network may perform an initial cell search by detecting a PSS from a BS (e.g., the PSS of a cell of the BS). The PSS may enable the UE to synchronize to period timing of the BS and may indicate a physical layer identity value assigned to the cell. The UE may also receive an SSS from the BS that enables the UE to synchronize on the radio frame level with the cell. The SSS may also provide a cell identity value, which the UE may combine with the physical layer identity value to identify the cell.

After receiving the PSS and SSS, the UE may receive system information from the BS. The system information may take the form of a master information block (MIB) and system information blocks (SIBs). The system information includes essential or critical information for a UE to access the network such as downlink (DL) channel configuration information, uplink (UL) channel configuration information, access class information, and cell barring information, as well as other less critical information. The MIB may include system information for initial network access and scheduling information for RMSI and/or OSI. After decoding the MIB, the UE may receive RMSI and/or OSI.

After obtaining the MIB, the RMSI and/or the OSI, the UE may perform a random access procedure for initial access to a RAN (e.g., the RAN 200 of FIG. 2). The RAN (e.g., a base station) broadcasts information that enables a UE to determine how to conduct the initial access. This information may include a configuration for a random access channel (RACH) that the UE uses to communicate with the RAN during initial access. The RACH configuration may indicate, for example, the resources allocated by the RAN for the RACH (e.g., resources allocated for transmitting RACH preambles and receiving random access responses).

For the random access procedure, the UE may transmit a random access preamble and the BS may respond with a random access response. Upon receiving the random access response, the UE may transmit a connection request to the BS and the BS may respond with a connection response (e.g., contention resolution message). After establishing a connection, the UE and the BS may enter a normal operation stage, where operational data may be exchanged. For example, the BS may schedule the UE for UL communication and/or DL communication.

In an UL transmission, the transmitting device (e.g., the scheduled entity 106) may utilize one or more REs 306 to carry UL control information including one or more UL control channels, such as a physical uplink control channel (PUCCH), to the scheduling entity. UL control information may include a variety of packet types and categories, including pilots, reference signals, and information configured to enable or assist in decoding uplink data transmissions. For example, the UL control information may include a DMRS or an SRS. In some examples, the control information may include a scheduling request (SR), i.e., request for the scheduling entity to schedule uplink transmissions. Here, in response to the SR transmitted on the control channel, the scheduling entity may transmit downlink control information that may schedule resources for uplink packet transmissions. UL control information may also include hybrid automatic repeat request (HARQ) feedback, channel state feedback (CSF), or any other suitable UL control information.

In addition to control information, one or more REs 306 (e.g., within the data region 314) may be allocated for user data traffic. Such traffic may be carried on one or more traffic channels, such as, for a DL transmission, a physical downlink shared channel (PDSCH); or for an UL transmission, a physical uplink shared channel (PUSCH). In some examples, one or more REs 306 within the data region 314 may be configured to carry SIBs (e.g., SIB1), carrying information that may enable access to a given cell.

These physical channels described above are generally multiplexed and mapped to transport channels for handling at the medium access control (MAC) layer. Transport channels carry blocks of information called transport blocks (TB). The transport block size (TBS), which may correspond to a number of bits of information, may be a controlled parameter, based on the modulation and coding scheme (MCS) and the number of RBs in a given transmission.

The channels or carriers described above in connection with FIGS. 1-3 are not necessarily all of the channels or carriers that may be utilized between a scheduling entity and scheduled entities, and those of ordinary skill in the art will recognize that other channels or carriers may be utilized in addition to those illustrated, such as other traffic, control, and feedback channels.

Figure 4:
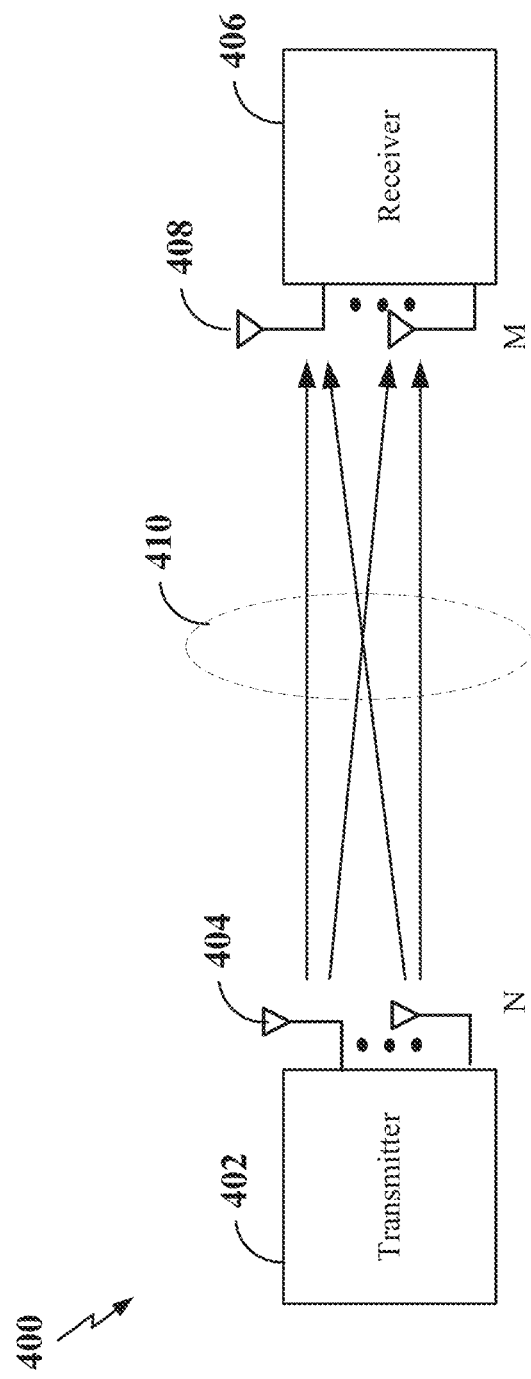
FIG. 4 is a block diagram illustrating an example of a wireless communication system supporting beamforming and/or multiple-input multiple-output (MIMO) communication according to some aspects.

In some aspects of the disclosure, the scheduling entity and/or scheduled entity may be configured for beamforming and/or multiple-input multiple-output (MIMO) technology. FIG. 4 illustrates an example of a wireless communication system 400 supporting beamforming and/or MIMO. In a MIMO system, a transmitter 402 includes multiple transmit antennas 404 (e.g., N transmit antennas) and a receiver 406 includes multiple receive antennas 408 (e.g., M receive antennas). Thus, there are N×M signal paths 410 from the transmit antennas 404 to the receive antennas 408. Each of the transmitter 402 and the receiver 406 may be implemented, for example, within a scheduling entity, a scheduled entity, or any other suitable wireless communication device.

The use of such multiple antenna technology enables the wireless communication system to exploit the spatial domain to support spatial multiplexing, beamforming, and transmit diversity. Spatial multiplexing may be used to transmit different streams of data, also referred to as layers, simultaneously on the same time-frequency resource. The data streams may be transmitted to a single UE to increase the data rate or to multiple UEs to increase the overall system capacity, the latter being referred to as multi-user MIMO (MU-MIMO). This is achieved by spatially precoding each data stream (i.e., multiplying the data streams with different weighting and phase shifting) and then transmitting each spatially precoded stream through multiple transmit antennas on the downlink. The spatially precoded data streams arrive at the UE(s) with different spatial signatures, which enables each of the UE(s) to recover the one or more data streams destined for that UE. On the uplink, each UE transmits a spatially precoded data stream, which enables the base station to identify the source of each spatially precoded data stream.

The number of data streams or layers corresponds to the rank of the transmission. In general, the rank of the wireless communication system 400 (MIMO system) is limited by the number of transmit or receive antennas 404 or 408, whichever is lower. In addition, the channel conditions at the UE, as well as other considerations, such as the available resources at the base station, may also affect the transmission rank. For example, the rank (and therefore, the number of data streams) assigned to a particular UE on the downlink may be determined based on the rank indicator (RI) transmitted from the UE to the base station. The RI may be determined based on the antenna configuration (e.g., the number of transmit and receive antennas) and a measured signal-to-interference-and-noise ratio (SINR) on each of the receive antennas. The RI may indicate, for example, the number of layers that may be supported under the current channel conditions. The base station may use the RI, along with resource information (e.g., the available resources and amount of data to be scheduled for the UE), to assign a transmission rank to the UE.

In one example, as shown in FIG. 4, a rank-2 spatial multiplexing transmission on a 2×2 MIMO antenna configuration will transmit one data stream from each transmit antenna 404. Each data stream reaches each receive antenna 408 along a different signal path 410. The receiver 406 may then reconstruct the data streams using the received signals from each receive antenna 408.

Beamforming is a signal processing technique that may be used at the transmitter 402 or receiver 406 to shape or steer an antenna beam (e.g., a transmit beam or receive beam) along a spatial path between the transmitter 402 and the receiver 406. Beamforming may be achieved by combining the signals communicated via antennas 404 or 408 (e.g., antenna elements of an antenna array module) such that some of the signals experience constructive interference while others experience destructive interference. To create the desired constructive/destructive interference, the transmitter 402 or receiver 406 may apply amplitude and/or phase offsets to signals transmitted or received from each of the antennas 404 or 408 associated with the transmitter 402 or receiver 406.

In 5G New Radio (NR) systems, particularly for above 6 GHz or mmWave systems, beamformed signals may be utilized for most downlink channels, including the physical downlink control channel (PDCCH) and physical downlink shared channel (PDSCH). In addition, broadcast control information, such as the SSB, slot format indicator (SFI), and paging information, may be transmitted in a beam-sweeping manner to enable all scheduled entities (UEs) in the coverage area of a transmission and reception point (TRP) (e.g., a gNB) to receive the broadcast control information. In addition, for UEs configured with beamforming antenna arrays, beamformed signals may also be utilized for uplink channels, including the physical uplink control channel (PUCCH) and physical uplink shared channel (PUSCH).

A base station (e.g., gNB) may generally be capable of communicating with UEs using transmit beams (e.g., downlink transmit beams) of varying beam widths. For example, a base station may be configured to utilize a wider beam when communicating with a UE that is in motion and a narrower beam when communicating with a UE that is stationary. The UE may further be configured to utilize one or more downlink receive beams to receive signals from the base station. In some examples, to select one or more downlink transmit beams and one or more downlink receive beams for communication with a UE, the base station may transmit a reference signal, such as an SSB or CSI-RS, on each of a plurality of downlink transmit beams in a beam-sweeping manner. The UE may measure the reference signal received power (RSRP) on each of the downlink transmit beams using one or more downlink receive beams on the UE and transmit a beam measurement report to the base station indicating the RSRP of each of the measured downlink transmit beams. The base station may then select one or more serving downlink beams (e.g., downlink transmit beams and downlink receive beams) for communication with the UE based on the beam measurement report. The resulting selected downlink transmit beam and downlink receive beam may form a downlink beam pair link. In other examples, when the channel is reciprocal, the base station may derive the particular downlink beam(s) to communicate with the UE based on uplink measurements of one or more uplink reference signals, such as sounding reference signals (SRSs).

Similarly, uplink beams (e.g., uplink transmit beam(s) at the UE and uplink receive beam(s) at the base station) may be selected by measuring the RSRP of received uplink reference signals (e.g., SRSs) or downlink reference signals (e.g., SSBs or CSI-RSs) during an uplink or downlink beam sweep. For example, the base station may determine the uplink beams either by uplink beam management via a SRS beam sweep with measurement at the base station or by downlink beam management via an SSB/CSI-RS beam sweep with measurement at the UE. The selected uplink beam may be indicated by a selected SRS resource (e.g., time-frequency resources utilized for the transmission of a SRS) when implementing uplink beam management or a selected SSB/CSI-RS resource when implementing downlink beam management. For example, the selected SSB/CSI-RS resource can have a spatial relation to the selected uplink transmit beam (e.g., the uplink transmit beam utilized for the PUCCH, SRS, and/or PUSCH). The resulting selected uplink transmit beam and uplink receive beam may form an uplink beam pair link.

As discussed earlier, certain multiple events (i.e., "multiple" meaning two or more events or a plurality of events) may occur in a wireless communication network with respective degrees of probability such that there is asymmetric probability between the multiple events. In an example, such events may be corresponding or alternative events (or messages) such as HARQ-ACK/NACK feedback from a UE to a base station in response to the HARQ. In this example, the probability of a non-acknowledgement (NACK) feedback being sent from a user equipment (UE) to a base station in response to a hybrid automatic repeat request (HARQ) may be a lower probability than an acknowledgement (ACK) feedback being sent. In a further example, it is assumed that a probability of an ACK being sent is equal to a value p (i.e., prob(ACK)=p) and probability of a NACK being sent is equal to a value q (i.e., prob (NACK)=q). In the case of enhanced mobile broadband (eMBB), the value p is greater than q (i.e., p>q) and in the case of ultra-reliable low-latency communication (URLLC) the value of p may be much greater than q (i.e., p>>q). For example, the probability of a NACK transmission in URLLC may be around 0.01% in some instances, which makes the occurrence of a NACK feedback transmission or indication quite rare for some types of 5G communication. In the example of HARQ-ACK/NACK, a HARQ-ACK codebook (e.g., PDSCH HARQ-ACK codebook list) used for transmitting the HARQ-ACK feedback uses a K number of bits and those bits are used to send or indicate the ACK or NACK feedback. It is noted here that a HARQ-ACK codebook has a K number of bits where each bit of the K bits in the HARQ-ACK codebook is considered an "event" as used herein. The event has two outcomes; namely either an ACK (A) or a NACK (N). Further, it is noted that for purposes of this application that a "message" may consist of the outcomes of the K number events. For example, all of the K bits indicating ACK events (e.g., AAA . . . AA) constitutes one message. In another example, a NACK at the tail of the codebook (e.g., AAA . . . AN) is another message. Each message will have a different probability dependent on the outcomes of the events.

Figure 5:
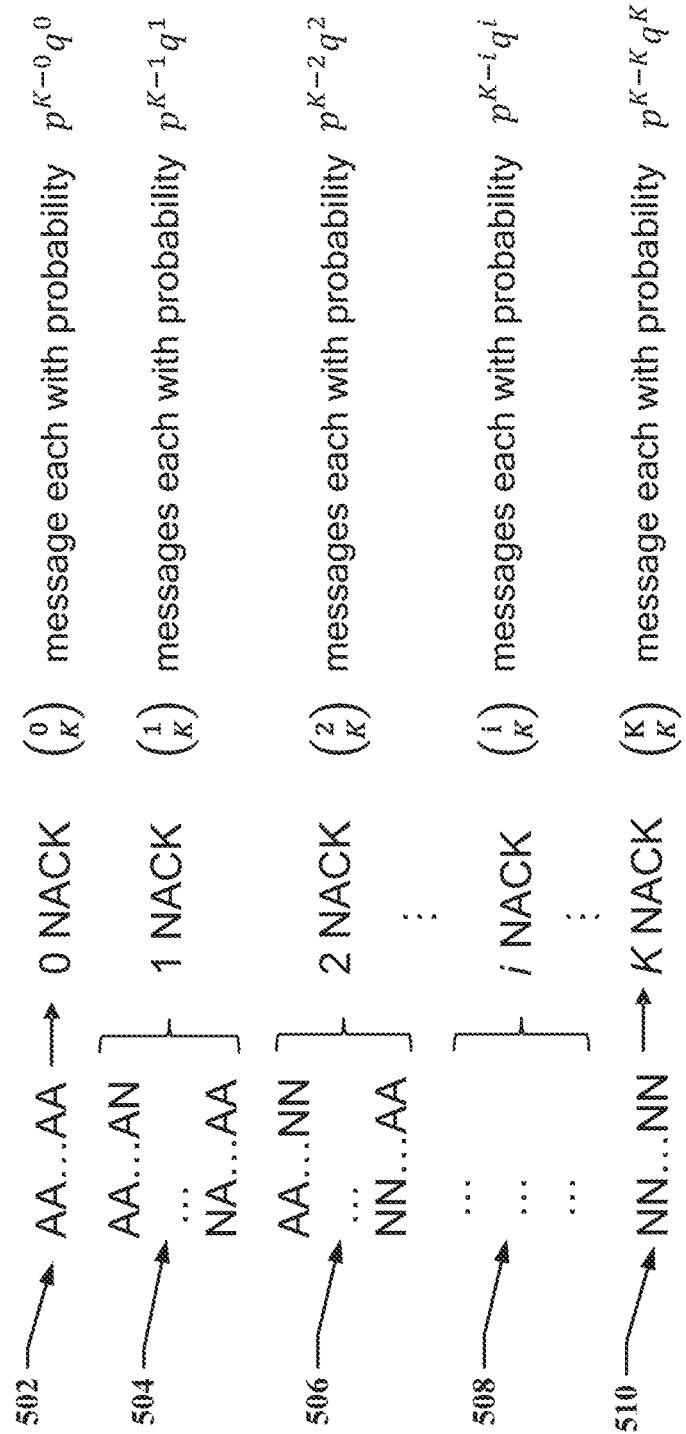
FIG. 5 is diagram illustrating probabilities of event occurrences in an example of NACK transmission in a wireless communication system.

As an illustration of the probability of event occurrences in the example of ACK/NACK, FIG. 5 shows an example of the probability of ACK or NACK transmissions for a HARQ-ACK codebook of K bits. As illustrated at message 502, when only ACKs and no NACKs are transmitted (as illustrated by all "A"s in the bits of the codebook bits $$\left(\text{i.e., } \binom{0}{K}\right)$$

or zero of the K bits or "K choose zero"), where the ACK/NACK indication may be a one bit flag or value indicating either ACK or NACK), the probability of a K-ACK event is $p^{K-0}$ or simply $p^K$ and the probability of a zero (0)-NACK event is $q^0$.

At 504, a one (1) NACK probability is shown where 1 out of K bits in the codebook will be a NACK as shown by the various combinations of bits with "A" ACKs and one "N" NACK. Here there may be a K number of combinations where the NACK (N) may occur at any of the K number of bit locations as illustrated by the first and last combinations at messages 504 for brevity's sake, but it is appreciated that the N NACK for a 1 NACK probability might occur at one of the K bits. The probability of this event (i.e., K−1 ACKs and 1-NACK or $$\binom{1}{K},$$

which is one of the K bits or "K choose 1") may be expressed as $p^{K-1}q^1$. It is noted that in URLLC, for example, this case would occur most commonly given an approximate 0.01% likelihood or probability of a NACK being sent.

At messages 506, a two (2) NACK probability is shown where 2 out of the K bits in the codebook will be a NACK as shown by the various combinations of bits with "A" ACKs and two "N" NACKs. There may be $$\binom{2}{K},$$

which is termed "K choose 2," combinations where the NACKs occur at two bit locations of the K bit locations. The probability in this instance may be expressed as $p^{K-2}q^2$. The case for messages 508 shows an "i" number NACK occurrences out of the K bits. In this case the probability of this event would be $p^{K-i}q^i$ for "K choose i" combinations. Finally, at message 510, the case of all NACKs (i.e., a K number NACKs) of the K bits is shown with the probability being $p^{K-K}q^K$. Accordingly, it may be seen that the probability p becomes less as K NACK events is approached, which is an extremely rare occurrence.

It is noted that in the case of rare events such as the case of a low probability transmission of a NACK in URLLC or even in eMBB, the use of all of the codebook bits utilizes a large payload size that is at most times unnecessary. Accordingly, accounting for the rarity of certain events, the present disclosure provides for compression of signaling of such events, with the example of a PDSCH HARQ-ACK codebook being only one example of how such compression could be utilized for rare events. Compressing the bits to account for rare events serves to reduce payload size of transmissions and overhead processing. In a particular aspect, the compression disclosed herein compresses multiple messages into a single message. For example, messages with 2 NACK events through a message with K NACK events may be compressed into a single message, or groups of messages having a same number of NACK events may be compressed together. Of further note, without compression as shown in the example of FIG. 5, the whole set of messages has a cardinality equal to $2^K$. With compression, the cardinality of the message set may be made much smaller as will be discussed with reference to FIGS. 6 and 7.

Figure 6:
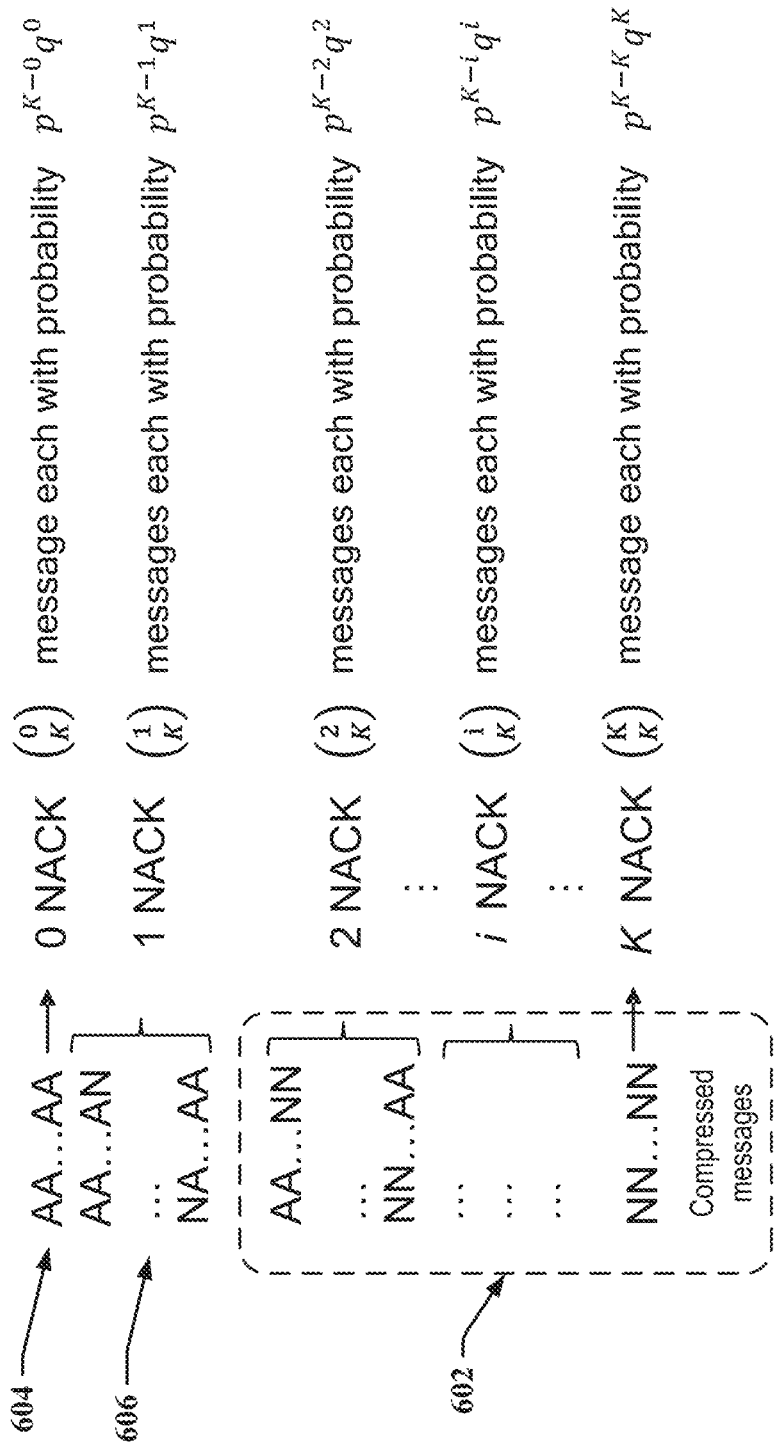
FIG. 6 is a diagram illustrating an example of a methodology for compressing the probabilities of event occurrences in an example of HARQ-ACK/NACK transmission in a wireless communication system according to some aspects.

In an example of compression in the case of a PDSCH HARQ-ACK codebook, FIG. 6 illustrates that for rare events beyond a predetermined threshold amount (or for a probability of occurrence of select events above a certain threshold), the events may be compressed into a single event. For example, messages having an L number of NACKs or greater may be compressed into a single event wherein the compression affords the ability to use less bits for sending the NACKs on the UL from a UE to a gNB, for example. In the example shown in FIG. 6, if L=2, then compression is performed for messages with 2 or more NACKs as shown encompassed or grouped by a representative box 602, which would represent a single message for instances of messages with 2 through K NACK events. For the zero (0) NACK or one (1) NACK events shown at 604 and 606, respectively, no compression would be performed for these events in this example as compression would not make sense nor would it effect any savings for transmissions.

It is noted that without compression, a UE will feedback one of the messages in the message set. Since there are $2^K$ messages in total, a UE needs to feedback a $\log_2(2^K)$ number of bits (i.e., K bits) to indicate the feedback message. With compression, however, there are K+2 messages in the set in the example of FIG. 6, and the UE only needs to feedback a $\text{ceil}(\log_2(K+2))$ number of bits to indicate the feedback message. Typically, $\text{ceil}(\log_2(K+2))$ is smaller than K, and thus compression can reduce the feedback payload size (i.e., the number of bits).

According to further aspects, it is noted that the compression of the L or greater events may be determined according to the following relationship:

$$\log_2\left(1 + \sum_{l=0}^{L-1} \binom{l}{K}\right)$$

where this relationship shows the number of bits resulting from the compression of the messages. As an example, when messages with 2 or more NACK events are compressed into a single message, as illustrated at 602 in the example of FIG. 6, the total number of messages after compression would be 1+K+1 wherein the number of bits would then be log$_2$(K+2). This may be determined visually as well from FIG. 6 where one message is indicated for the zero NACK event 604 as there is only one possible event, a K number of messages would only need to be indicated for the one NACK event at 606 as there are K different combinations possible, and then a final single message resulting from compression would be indicated for the 2 NACK and above events, where the messages are compressed into one message as shown by block 602; hence 1+K+1 messages that would be needed to be indicated. In an example where K=10 bits for a codebook, K=1 after compression the number of bits that would be used is log$_2$(12)=3.58, which would be rounded up to 4 bits minimum (i.e., ceil log$_2$(12)) that would be needed for transmission of the 12 messages in this example. Thus, a reduction from 10 bits to 4 bits is engendered by the compression in this example. While there is a bit reduction, it will be appreciated that there is also a loss of information (i.e., lossy encoding due to compression), and if a NACK (or generally, the rare event) is indicated, the receiving gNB will then need to retransmit a request (e.g., retransmit the HARQ request on the PDSCH) and the UE would then need to respond on the UL (e.g., ACK/NACK on PUCCH or PUSCH) without compression for the gNB to be able to determine the specific event information that was lost due to the previous compression (i.e., the loss of information due to the lossy encoding).

Of further note, in the case where UE feedback is used to indicate that the compressed rare messages occur (e.g., a message with two or more NACKs out of total KHARQ-ACKs), a gNB will not know which PDSCHs out of the KPDSCHs have failed decoding. Accordingly, in such case the gNB will retransmit all the K PDSCHs. Notwithstanding, as the message of two or more NACKs occurs with very rare probability, the need for retransmission of all K PDSCHs will be very rare as well.

Figure 7:
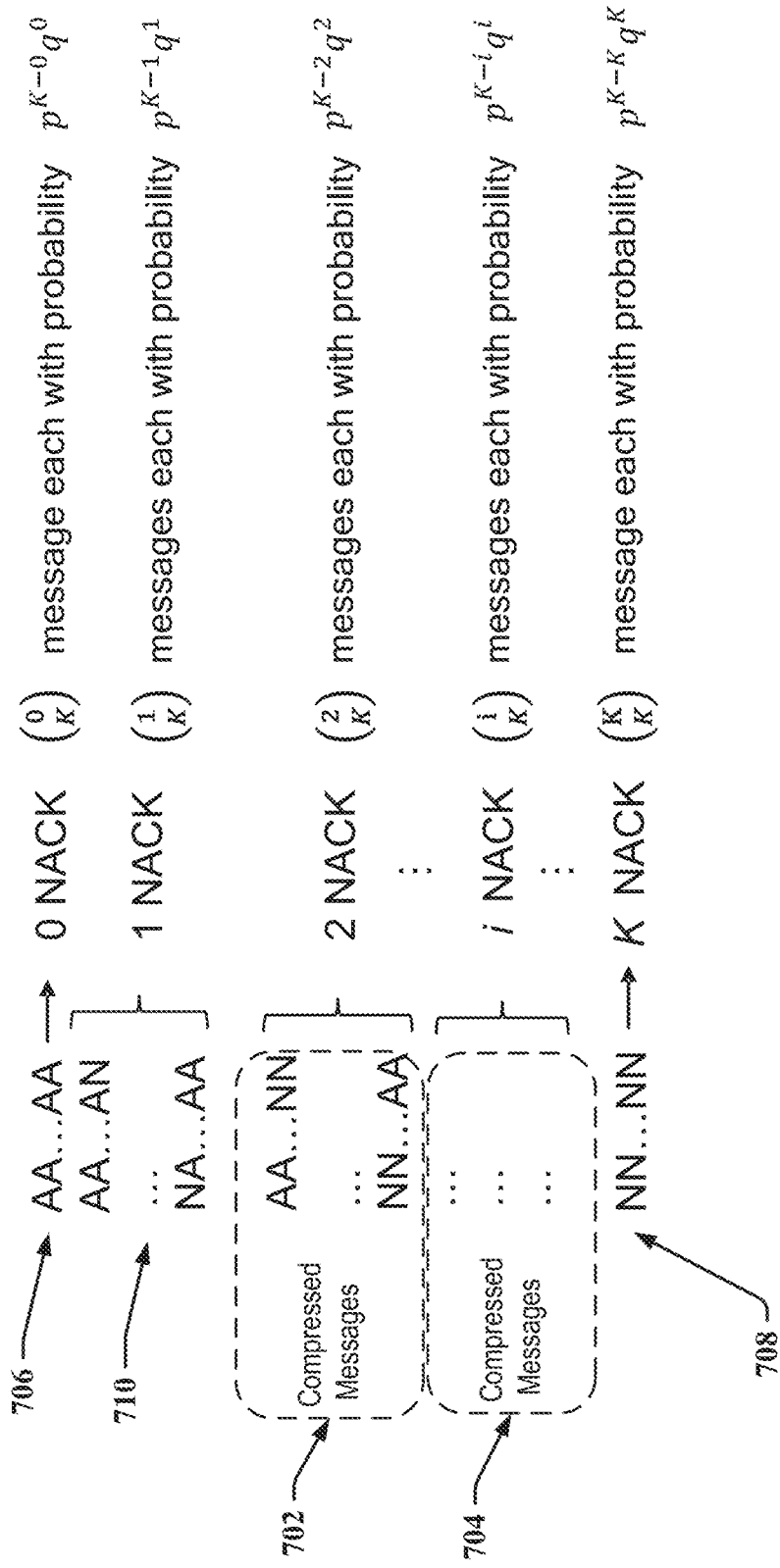
FIG. 7 is a diagram illustrating another example of a methodology for compressing the probabilities of event occurrences in an example of HARQ-ACK/NACK transmission in a wireless communication system according to some aspects.

FIG. 7 illustrates another example of compression that balances compression of rare events with being able to provide more information to the gNB. In this example, rather than compress all messages above an L threshold amount or probability of occurrence into a single message as in the example of FIG. 6, the occurrence of messages having a same number of events (e.g., a same number of NACKs) above the L threshold amount are respectively compressed into a single message.

In an example, for a message with L or more NACKs, a group of messages with an i number of events (e.g., i number of NACKs) is compressed into a single event. In the case of threshold of L, the number of bits after compression may be determined according to the expression:

$$\log_2\left((K-L+1) + \sum_{i=0}^{L-1}\binom{l}{K}\right).$$

In an example where L=2, compression would be performed for each group or set of messages having the same number of events, such as shown at 702 in FIG. 7 where all $$\binom{2}{K}$$

number of messages having 2 NACK are compressed to a single message 702. Similarly, for an i$^{th}$ value (i.e., a value larger than L) with i NACKs, the $$\binom{i}{K}$$

number of possible combinations is compressed to a single message 704, and so forth. In the case the zero NACK case shown at 706, no compression is performed as there is only one combination (i.e., one message) possible. Similarly, in the case of all NACKs shown at 708, again no compression is needed as there is only one combination (i.e., one message) possible.

Continuing with the example of L=2, the message (or group of events that may be an ACK or a NACK) having one NACK (i.e., 1<L) shown at 710 would not be compressed and the K number of possible events would be transmitted. Accordingly, the number of messages would be 1+K+K−2+1, which is 2K. Accordingly, the number of bits after compression would be log$_2$(2K). Thus, taking an example where K=10, the number of bits after compression would be 4.32 and, thus, a minimum of 5 bits could be utilized (i.e., ceil(log$_2$(2K)), which still represents a significant reduction in payload. Additionally, in the example of FIG. 7, the compression by groups of messages having the same number of events affords the ability to provide the gNB with information of at least how many NACKs the UE was supposed to have sent. This information concerning the number of NACKs can be used at a gNB to adjust the outer loop for link adaptation (e.g., OLLA), for example.

In operation, it is noted that either the UE or the network (e.g., the gNB) may be able to adjust the threshold level L discussed above. In some aspects, the adjustment may be based on the uplink channel quality, such as uplink channel quality determined by the gNB based on channel state information (CSI) received from the UE, as merely one example. In the case of ACK/NACK as discussed above, if the channel quality is high then the L number could be lowered as it would be anticipated that less NACKs will be sent (i.e., the probability of a NACK decreases) and more compression would not be detrimental as the gNB will likely not need to retransmit a HARQ. On the other hand, if the channel quality is low the L value may be raised to lessen the amount of compression as the probability of receiving a NACK increases due to channel conditions and less compression will reduce the number of HARQ request retransmissions.

In other aspects, it is noted that signaling may also be utilized to enable or disable the compression at the UE, as well as change the threshold L value as discussed above. In one example, RRC signaling from the network may be used to configure a UE to semi-statically enable or disable compression. In another example, downlink control information (DCI) may be used by the gNB to enable or disable compression at the UE. Furthermore, in the example of a HARQ-ACK codebook the manner of signaling the enablement/disablement of compression may be varied based on whether the codebook is transmitted in the PUCCH or the PUSCH.

Figure 8:
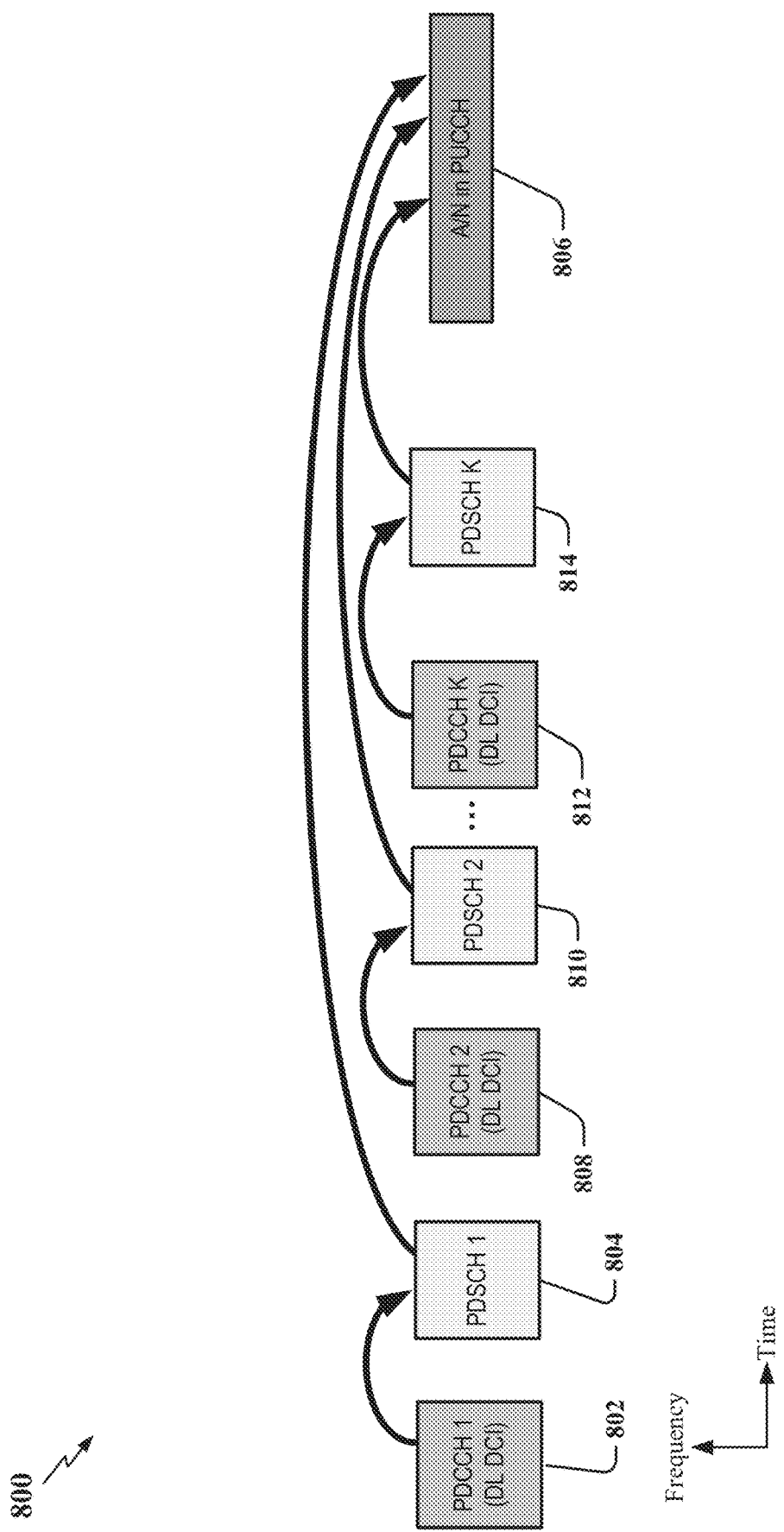
FIG. 8 illustrates an example of DCI signaling used to communicate enabling or disabling of compression at a UE according to some aspects.

FIG. 8 illustrates an example 800 of DCI signaling from the network (e.g., a gNB) used to communicate enabling or disabling of compression at a UE in scenario where the HARQ-ACK codebook is transmitted in a subsequent PUCCH (e.g., 806) by the UE. In the illustrated example, each PDCCH (e.g., 802, 808, or 812) may include DL scheduling DCI (DL DCI) for a subsequent PDSCH (e.g., 804, 810, or 814). For example, FIG. 8 shows PDCCH 802 may include DL DCI for the PDSCH 804 where the DL DCI indicates to the UE the location of the PDSCH. This indication of the PDSCH location is represented by arrows from the PDCCH to each subsequent PDSCH (e.g., arrows from 802 to 804, 808 to 810, and 812 to 814). The DL DCI may further include an indicator to either signal enabling or disabling of compression at the UE. In one aspect, this indicator may be a single bit in the DL DCI to indicate either enablement or disablement of compression for the UE. Additionally, each PDSCH (e.g., 804, 810, and/or 814) may include the ACK/NACK request for the UE to then send the ACK or NACK (A/N) in response thereto in a subsequent PUCCH as shown at 806, and which is illustrated by an arrow from each PDSCH to the subsequent PUCCH 806 in FIG. 8 (e.g., from PDSCH 804 to PUCCH 806, from PDSCH 810 to PUCCH 806, or from PDSCH 814 to PUCCH 806).

As illustrated in FIG. 8, there are multiple instances of the PDCCH scheduling the PDSCH and corresponding ACK/NACK indications that will be sent in the PUCCH 806. These further instances are illustrated by PDCCH 808 and PDSCH 810 for a second instance (PDCCH2, PDSCH2) up to a $K^{th}$ PDCCH 812 instance and a corresponding $K^{th}$ PDSCH 814, which correspondingly include DL DCI with the compression enable/disable indication and also communicate ACK/NACK requests to be answered with an ACK or NACK in the PUCCH 806. In an aspect, the last received DL DCI with the indicator for enabling/disabling compression may be the indication that is followed by the UE in the determination to enable or disable compression for the HARQ-ACK codebook as transmitted in PUCCH 806. In other words, regardless of the state of the indicator in each DL DCI within each PDCCH, the last received DL DCI indicator (or last transmitted indicator prior to PUCCH transmission) will be used by the UE to determine whether or not compression should be used when transmitting the ACK/NACK codebook in the PUCCH 806. Thus, in the example of FIG. 8, the indicator state in DL DCI in PDCCH K 812, being the last received DL DCI, would be used by the UE to decide whether or not to compress messages of the ACK/NACK codebook transmitted in the PUCCH 806.

Figure 9:
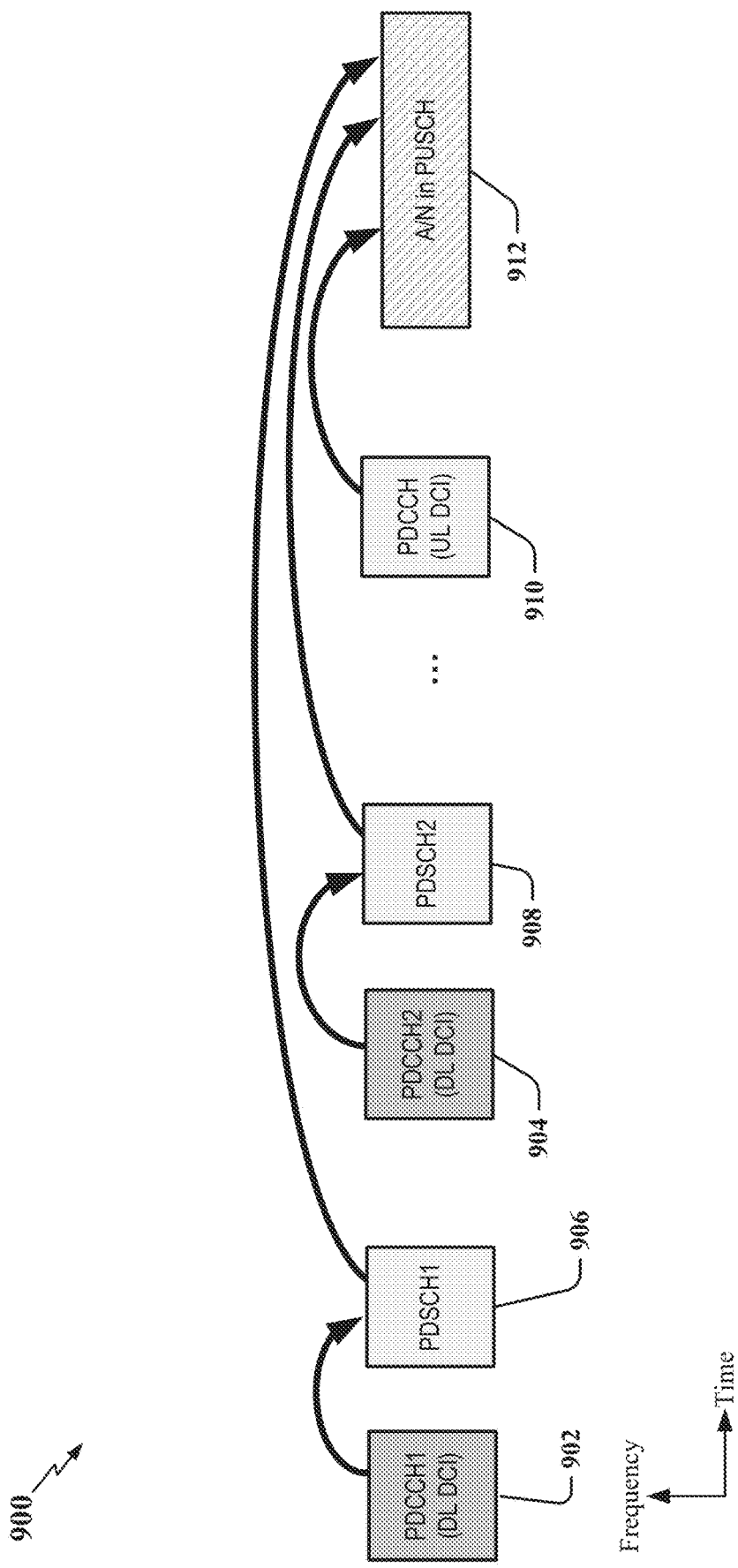
FIG. 9 illustrates another example of DCI signaling used to communicate enabling or disabling of compression at a UE according to some aspects.

In other aspects, it is noted that rather than a PUCCH, a PUSCH may instead be utilized to transmit an HARQ-ACK codebook from a UE to the gNB. In this case, the UE may follow a compression enable/disable indicator in a DCI scheduling the UL. FIG. 9 illustrates DCI signaling 900 in the case where the HARQ-ACK codebook is transmitted by a UE via the PUSCH. As shown, there may be various instances of the PDCCH 902 or 904 containing DL DCI for respectively scheduling the PDSCH 906 or 908, and this illustration is merely exemplary as there may be more, such as was shown in the example of FIG. 8. In the example of FIG. 9, a PDCCH 910 including UL scheduling DCI is shown. This UL DCI in the PDCCH 910 may include the enable/disable indicator for compression of the HARQ-ACK codebook. In this example, the PUSCH 912 from the UE is used to transmit the HARQ-ACK codebook and each PDSCH (e.g., 906, 908) may include HARQ requests for which the UE responds with ACK/NACK feedback (i.e., the HARQ-ACK codebook) on the PUSCH 912 as represented by the arrows from each PDSCH (e.g., 906 or 908) to PUSCH 912. In an aspect, the UE may utilize an enable/disable indicator in the UL DCI in PDCCH 910 that sched- ules the PUSCH 912 in order to determine whether to compress the HARQ-ACK codebook for transmission via the PUSCH 912.

Figure 10:
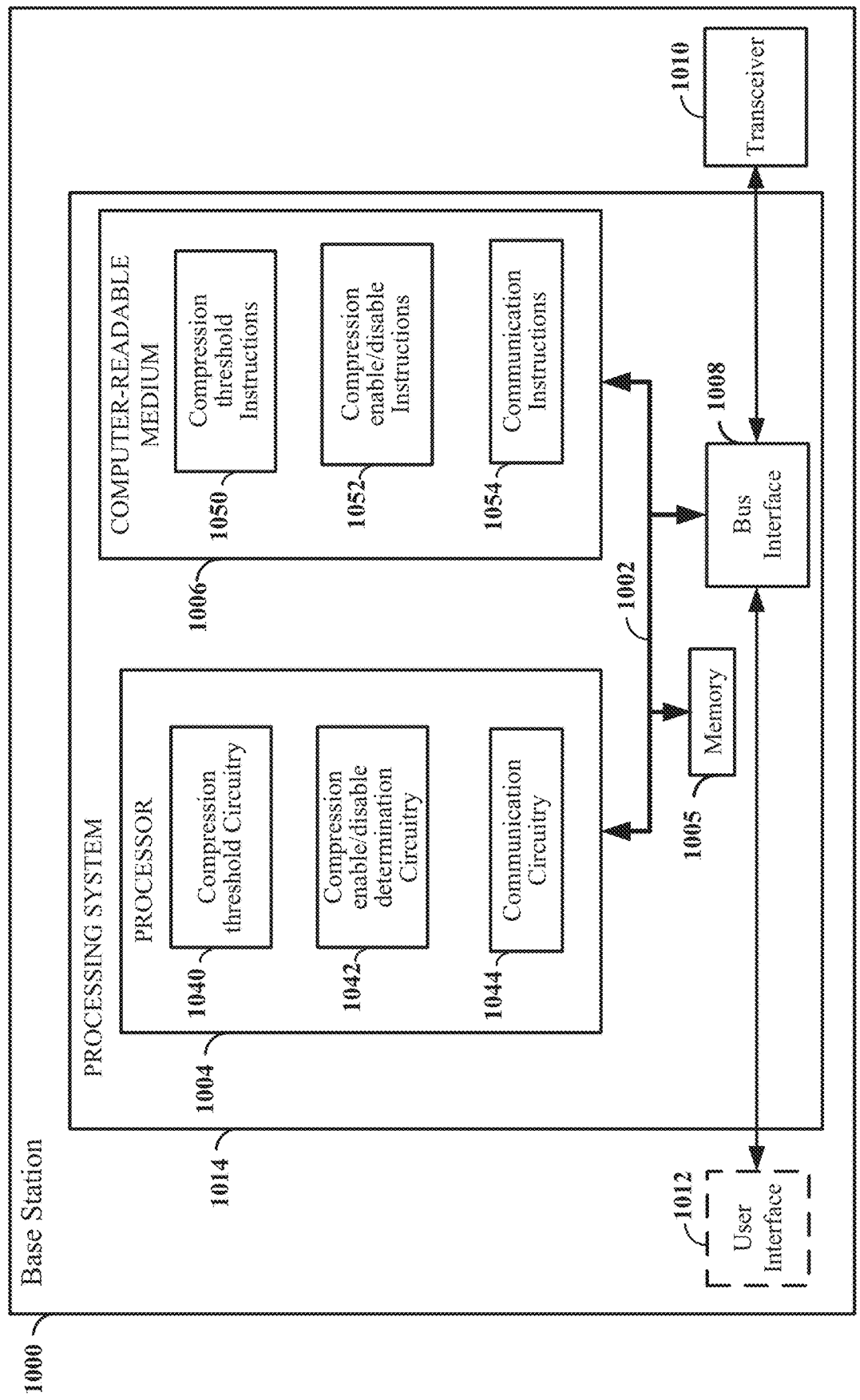
FIG. 10 is a block diagram illustrating an example of a hardware implementation for a wireless communication device employing a processing system according to some aspects.

FIG. 10 is a block diagram illustrating an example of a hardware implementation for base station or gNB 1000 (or other wireless transceiver) employing a processing system 1014. For example, base station 1000 may be any of the base stations (e.g., gNBs) illustrated in any one or more of FIGS. 1, 2, and 4.

The base station 1000 may be implemented with a processing system 1014 that includes one or more processors, such as processor 1004. Examples of processor 1004 include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In various examples, the base station 1000 may be configured to perform any one or more of the functions described herein. That is, the processor 1004, as utilized in base station 1000, may be used to implement any one or more of the processes described herein. The processor 1004 may in some instances be implemented via a baseband or modem chip and in other implementations, the processor 1004 may itself comprise a number of devices distinct and different from a baseband or modem chip (e.g., in such scenarios is may work in concert to achieve aspects discussed herein). And as mentioned above, various hardware arrangements and components outside of a baseband modem processor can be used in implementations, including RF-chains, power amplifiers, modulators, buffers, interleavers, adders/summers, etc.

In this example, the processing system 1014 may be implemented with a bus architecture, represented generally by the bus 1002. The bus 1002 may include any number of interconnecting buses and bridges depending on the specific application of the processing system 1014 and the overall design constraints. The bus 1002 communicatively couples together various circuits including one or more processors (represented generally by the processor 1004), and computer-readable media (represented generally by the computer-readable storage medium 1006). The bus 1002 may also link various other circuits such as timing sources, peripherals, voltage regulators, and power management circuits, which are well known in the art, and therefore, will not be described any further. A bus interface 1008 provides an interface between the bus 1002 and a transceiver 1010. The transceiver 1010 provides a means for communicating with various other apparatus over a transmission medium (e.g., air interface). A user interface 1012 (e.g., keypad, touchpad, display, speaker, microphone, etc.) may also be provided.

The processor 1004 is responsible for managing the bus 1002 and general processing, including the execution of software stored on the computer-readable storage medium 1006. The software, when executed by the processor 1004, causes the processing system 1014 to perform the various functions described herein for any particular apparatus. The computer-readable storage medium 1006 may also be used for storing data that is manipulated by the processor 1004 when executing software.

One or more processors (e.g., one or more processors such as processor 1004) in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable storage medium 1006.

The computer-readable storage medium 1006 may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable storage medium 1006 may reside in the processing system 1014, external to the processing system 1014, or distributed across multiple entities including the processing system 1014. The computer-readable storage medium 1006 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

In some aspects of the disclosure, the processor 1004 may include circuitry configured for various functions. For example, the processor 1004 may include a compression threshold determination circuitry 1040 for determining the predetermined threshold number (e.g., the value L as discussed above) of event occurrences above which compression is to be utilized in a UE. In other aspects, compression threshold determination circuitry 1040 may be configured to determine a threshold for the probability of occurrence of messages (i.e., a message having certain events therein as discussed above) is less than a threshold. In certain aspects, compression threshold determination circuitry 1040 may be configured to receive CSI or other channel state information from UL transmissions and adjust the compression threshold value (e.g., L) based on the quality of the channel state. In one example, compression threshold determination circuitry 1040 may include functionality for a means for determining and configuring the predetermined compression threshold number, including the compression threshold determination circuitry 1040, as well as memory 1005 and/or medium 1006 in other examples. The compression threshold determination circuitry 1040 may further be configured to execute compression threshold determination instructions 1050 stored in the computer-readable storage medium 1006 to implement any of the one or more of the functions described herein.

The processor 1004 may also include compression enable/disable determination circuitry 1042 configured to transmit, via the transceiver 1010, DL DCI that includes a compression enable/disable indicator as discussed above in connection with FIGS. 8 and 9. In other examples, the compression enable/disable determination circuitry 1042 may be configured to include the compression enable/disable indicator in a portion of the DL DCI transmitted or in every DL DCI transmission in some further aspects. In yet further aspects, the compression enable/disable determination circuitry 1042 may further be configured to execute compression enable/disable determination instructions 1052 stored in the computer-readable storage medium 1006 to implement any of the one or more of the functions described herein.

The processor 1004 may further include communication circuitry 1044 configured to utilize a communication link and communicate with a user equipment using access communication by aggregating at least two of a plurality of access component carriers for the multi-component carrier communication. The communication circuitry 1044 may further be configured to execute communication instructions 1054 stored in the computer-readable storage medium 1006 to implement any of the one or more of the functions described herein.

Figure 11:
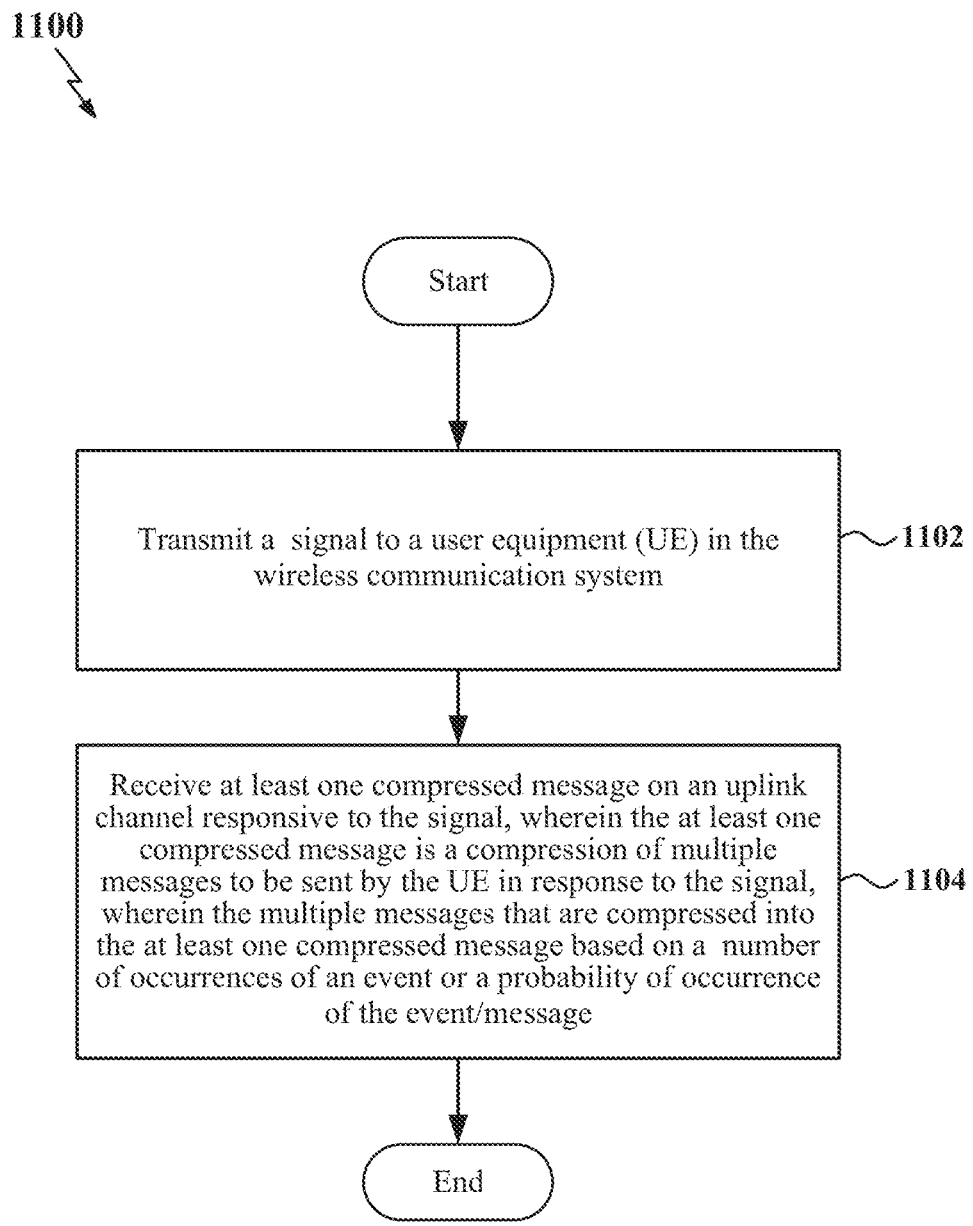
FIG. 11 is a flow chart of a method for wireless communication according to some aspects.

FIG. 11 is a flow chart of a method 1100 for wireless communication according to some aspects. As described below, some or all illustrated features may be omitted in a particular implementation within the scope of the present disclosure, and some illustrated features may not be required for implementation of all aspects. In some examples, the method may be performed by the base station 1000, as described above and illustrated in FIG. 10, by a processor or processing system, or by any suitable means for carrying out the described functions.

At block 1102, the base station 1000, for example, may transmit a signal to a user equipment (UE) in the wireless communication system. In aspects according to examples discussed herein, the signal may be a HARQ signal or indication for compression of NACK occurrences. In some aspects, the processes of block 1102 may be implemented by a means for transmitting a signal to a user equipment (UE) in the wireless communication system in any of the RAN nodes, base stations, scheduling entities, or gNBs discussed herein with regard to the FIG. 1, 2, 4, or 10 including, but not limited to, communication circuitry 1044 and transceiver 1010 in FIG. 10, or equivalents thereof.

Method 1100 further includes receiving at least one compressed message on an uplink channel responsive to the signal, wherein the at least one compressed message is a compression of multiple messages to be sent by the UE in response to the signal, wherein the multiple messages that are compressed into the at least one compressed message based on a have at least a predetermined threshold number of occurrences of an event or a probability of occurrence of the event as shown in block 1104. In other aspects, it is noted that the number of occurrences of the event may include either the number of ACKs or the number of NACKs. In the case of ACKs, a determination may be further made whether the number of ACKs is below some threshold. In the case of NACKs, the determination may be made whether the number of NACKs is above or equal to the threshold. In the case of the probability of the occurrence of a message, the determination may include that the probability is greater than a threshold as was illustrated in FIG. 6 or 7 could be greater than a threshold (e.g., the probability $p^{K-i}q^1$ for some $i^{th}$ value). In aspects, the processes of block 1104 may be implemented by means for receiving at least one compressed message on an uplink channel responsive to the transmitted signal, which may include, but is not limited to, communication circuitry 1044 and transceiver 1010 as shown in FIG. 10, or equivalents thereof.

Method 1100 also may include that the at least one compressed message includes groups of compressing message where each group is the compression of multiple messages having a same number of occurrences of an event or the same probability of occurrence. In other aspects, method 1100 includes compressing messages of the multiple messages having a same number of occurrences of the event or a same probability of occurrence into respective messages, and transmitting each of the respective messages on the uplink channel.

According to other aspects, method 1100 includes transmitting the at least one compressed message with one or more non-compressed messages. The one or more non-compressed messages includes a particular event, such as having all NACK feedback in the message, or having all ACK feedback in the message responsive to a hybrid automatic reply request (H-ARQ).

In other aspects, the compression technique includes a lossy encoding technique. and may further utilize a logarithmic compression. In one example, the predetermined number of occurrences may be set equal to a value L and a number of bits in a codebook used for transmitting the at least one compressed message on the uplink channel is configured with a K number of bits. The logarithmic compression may include compressing the multiple messages having the L number of event occurrences into a single compressed event such that a number of bits after compression is equal to $$\log_2\left(1 + \sum_{l=0}^{L-1}\binom{l}{K}\right).$$

In further aspects, method 1100 may include that the codebook comprises a hybrid automatic repeat request (HARQ) codebook. In still further aspects, method 1100 may include that the compression technique utilizes a logarithmic compression, wherein the predetermined number of occurrences is set equal to a value L, and a number of bits in a codebook used for transmitting the at least one compressed message on the uplink channel is configured with a K number of bits such that the logarithmic compression comprises compressing messages of the multiple messages into the groups of messages such that a number of bits after compression is equal to $$\log_2\left((K-L+1) + \sum_{l=0}^{L-1}\binom{l}{K}\right).$$

Furthermore, it is noted that the event in method 1100 comprises one or more acknowledgement (NACK) feedback responses that are responsive to a hybrid automatic repeat request (HARQ) received from a base station.

In still further aspects, it is noted that the UE may be configured by the wireless communication system to semi-statically perform compression of the multiple messages. In one example, the UE is configured semi-statically perform compression of the multiple messages through radio resource control (RRC) signaling from the wireless communication system. In another example, the UE receives, from a base station, at least one indication that compressing of the multiple messages is enabled, and compresses the multiple messages based on the at least one indication. In still further aspect, the at least one indication has two states respectively indicating that compressing of the multiple messages is enabled or that compressing of the multiple messages is disabled. According to another example, method 1100 includes that the at least one indication is in downlink control information (DCI) transmitted in a physical downlink control channel (PDCCH). The at least one indication used by the UE is a last DCI transmitted prior to transmission by the UE on the uplink channel according to one example. In another example, the DCI is a downlink (DL) scheduling DCI and the uplink channel is a physical uplink control channel (PUCCH). In yet another example, the DCI is an uplink (UL) scheduling DCI and the uplink channel is a physical uplink shared channel (PUSCH).

Figure 12:
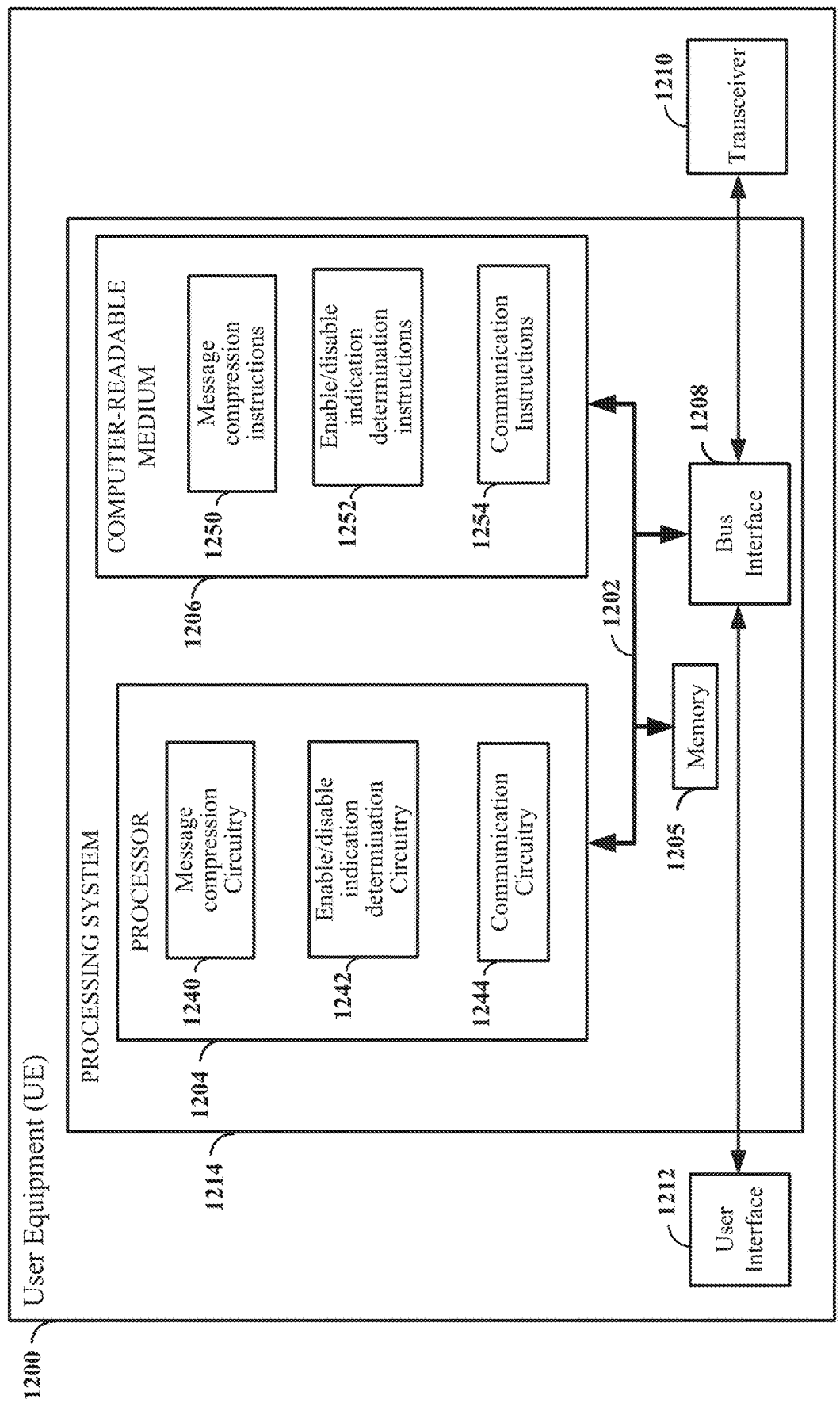
FIG. 12 is a block diagram illustrating an example of a hardware implementation for a wireless communication device employing a processing system according to some aspects.

FIG. 12 is a block diagram illustrating an example of a hardware implementation for a wireless communication device or UE 1200 (or other wireless transceiver) employing a processing system 1214 according to some aspects. For example, the wireless communication device or UE 1200 may correspond to any of the UEs shown and described above in any one or more of FIG. 1, 2, or 4, for example.

In accordance with various aspects of the disclosure, an element, or any portion of an element, or any combination of elements may be implemented with a processing system 1214 that includes one or more processors, such as processor 1204 as one example. The processing system 1214 may be substantially the same as the processing system 1014 illustrated in FIG. 10, including a bus interface 1208, a bus 1202, a processor 1204, and a computer-readable storage medium 1206. Furthermore, the UE 1200 may include a user interface 1212 and a transceiver 1210 substantially similar to those described above in FIG. 10. That is, the processor 1204, as utilized in a UE 1200, may be used to implement any one or more of the processes described herein.

In some aspects of the disclosure, the processor 1204 may include circuitry configured for various functions. For example, the processor 1204 may include message compression circuitry 1240 that is configured to effectuate the compression of events such as NACK events according to the various examples disclosed herein, including the examples of FIGS. 6 and 7. The message compression circuitry 1240 may include one or more hardware components that provide the physical structure that performs various processes related to event compression including accounting for the value L (or event occurrence threshold value above which message are compressed into at least one compressed message). In some examples, the message compression circuitry 1240 may include functionality for a means for compressing events, including the message compression circuitry 1240, as well as transceiver 1210 and memory 1205 in other examples. In other aspects, message compression circuitry 1240 may be configured to execute receiving instructions 1250 stored in the computer-readable storage medium 1206 to implement any of the one or more of the functions described herein.

In some aspects of the disclosure, the processor 1204 may include compression enable/disable determination circuitry 1242 configured to for determining whether the UE is to compress events or not as described before. In some aspects, the determination is based on DCI received from a gNB, for example, including reading a compression enable/disable indicator set by a gNB and transmitted in the DCI. In some examples, the compression enable/disable determination circuitry 1242 may include functionality for a means for receiving, including the compression enable/disable determination circuitry 1242, as well as transceiver 1210 in other examples. In other aspects, compression enable/disable determination circuitry 1242 may be configured to execute compression enable/disable determination instructions 1252 stored in the computer-readable storage medium 1206 to implement any of the one or more of the functions described herein.

The processor 1204 may further include communication circuitry 1244 configured to utilize a communication link and communicate with a base station. The communication circuitry 1244 may further be configured to execute communication instructions 1254 stored in the computer-readable storage medium 1206 to implement any of the one or more of the functions described herein.

Figure 13:
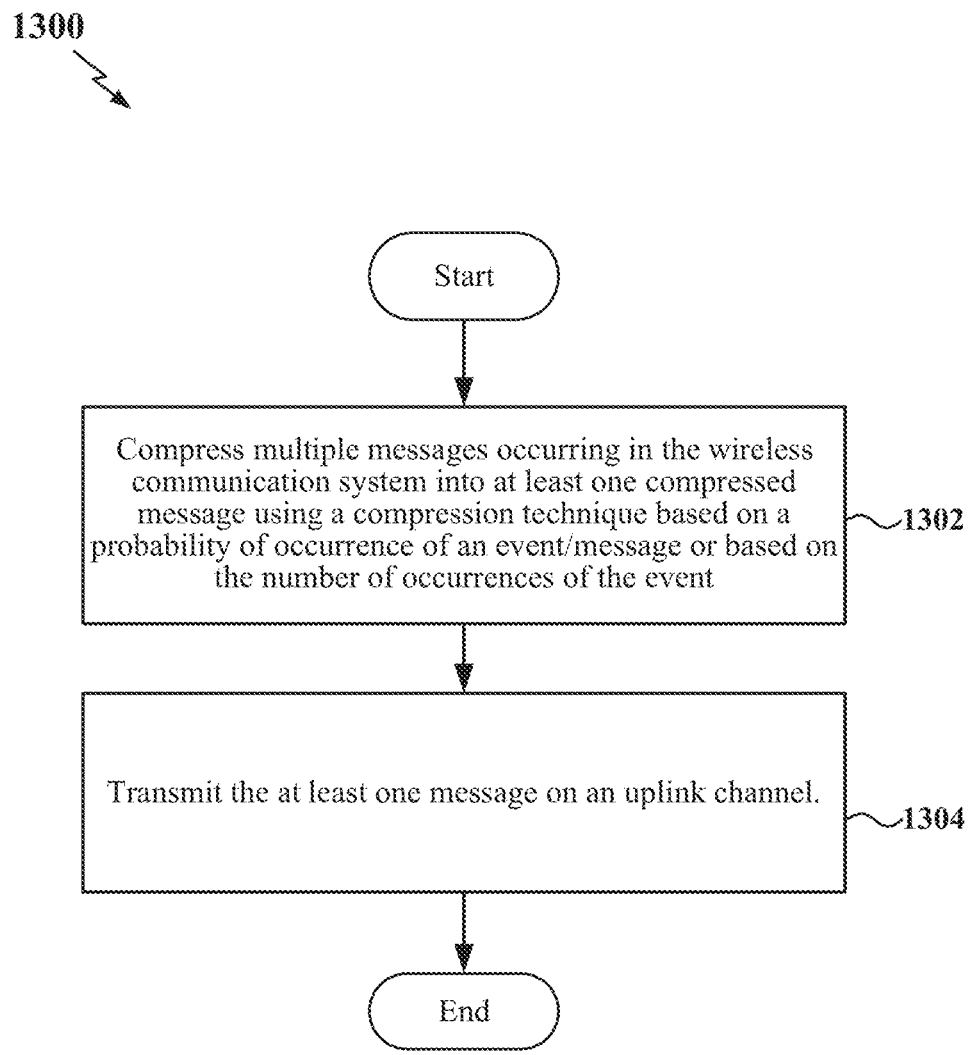
FIG. 13 is a flow chart of a method for wireless communication according to some aspects.

FIG. 13 is a flow chart of a method 1300 for communication including event compression according to some aspects. In some examples, the method 1300 may be performed by the UE 1200, as described above and illustrated in FIG. 12, by a processor or processing system, or by any suitable means for carrying out the described functions.

At block 1302, the UE 1200, for example, may include compressing multiple messages occurring in the wireless communication system based on a probability of occurrence of an event (or message) or a number of occurrences of an event (e.g., NACKs) into at least one compressed message using a compression technique, such as the compression techniques discussed above. In an aspect, the processes of block 1302 may be implemented by means for compressing multiple messages, which may include message compression circuitry 1240 in one example, or equivalents thereof, and may also implement either of the processes illustrated in FIG. 6 or 7 as well.

Method 1300 further includes transmitting the at least one compressed message on an uplink (UL) channel to a gNB as shown at block 1304. Furthermore, in one aspect it is noted that the at least one message includes the compressed message as shown at 602 in FIG. 6, or the compressed messages as shown at either 702 or 704 in FIG. 7. In an aspect, the processes of block 1304 may be implemented by means for transmitting the least one compressed message on an UL channel, which may include communication circuitry 1244 and transceiver 1210 in an example, or equivalents thereof.

Of note here, in an example where the compression of the multiple messages is based on the probability of occurrence for a message of the multiple messages. the determination may be based further on compressing those messages having a probability less than a threshold probability. As an example from FIG. 6, messages having the probability of $p^{K-2}q^2$ or less will be compressed as shown by block 602. In another example where the event occurrence considered in block 1302 of method 1300 may be a NACK, messages having the predetermined number of NACK events or more may be compressed into a single message as discussed previously. In another example, however, the "event" may be defined as an ACK. In this case, messages with the number of ACK events less than a threshold would then be compressed into a single message.

Method 1300 also includes an example where the at least one compressed message includes a plurality of compressed messages with each message including a respective group of compressed messages having a same number of occurrences of the event or a same probability of occurrence. Additionally, method 1300 include receiving one or more non-compressed messages with the at least one compressed message. The signal transmitted to the UE may include at least one hybrid automatic repeat request (HARQ) signal according to other examples. Additionally, the least one compressed message may include a HARQ acknowledgement/non-acknowledgment (ACK/NACK) codebook.

In still other examples, method 1300 may include the base station configured to configure the UE to semi-statically perform compression of the multiple messages. In an aspect, this configuration may be accomplished by the base station through sending radio resource control (RRC) signaling to the UE.

In yet another example, method 1300 may include sending at least one indication to the UE that compressing of the multiple messages is enabled. The at least one indication may have two states respectively indicating that compressing of the multiple messages is enabled or that compressing of the multiple messages is disabled. In one example, the at least one indication is in transmitted in downlink control information (DCI) transmitted in a physical downlink control channel (PDCCH). In other aspects, the DCI is a downlink (DL) scheduling DCI and the uplink channel is a physical uplink control channel (PUCCH). In yet further aspects, the DCI is an uplink (UL) scheduling DCI and the uplink channel is a physical uplink shared channel (PUSCH). In still further aspects, method 1300 may include determining the predetermined threshold number of occurrences of events, and then transmitting the predetermined threshold to the UE. Further, determining the predetermined threshold number of occurrences includes receiving channel state information (CSI) from the UE, and determining a value for the predetermined threshold based on the received CSI.

In yet other aspects, method 1300 includes determining the threshold of the probability of occurrence and then transmitting the threshold to the UE. Determining of the threshold may include receiving channel state information (CSI) from the UE, and determining a value for the predetermined threshold based on the received CSI.

The following provides an overview of aspects of the present disclosure:

Aspect 1: A method for transmitting messages from a user equipment (UE) in a wireless communication system, the method comprising: compressing multiple messages occurring in the wireless communication system into at least one compressed message using a compression technique based on a probability of occurrence of an event or a number of occurrences of the event, and transmitting the at least one compressed message on an uplink channel.

Aspect 2: The method of aspect 1, further comprising: compressing the multiple messages occurring in the wireless communication system into the at least one compressed message based on the probability of occurrence of the event having a probability less than a threshold probability.

Aspect 3: The method of aspect 1, further comprising: compressing the multiple messages occurring in the wireless communication system into the at least one compressed message based on the probability of occurrences of the event for messages having the probability of occurrences of the event that exceed a predetermined threshold.

Aspect 4: The method of aspect 1, further comprising: compressing the multiple messages occurring in the wireless communication system into the at least one compressed message based on the number of occurrences of the event for messages having the number of occurrences of the event that are less than a predetermined threshold.

Aspect 5: The method of any of aspects 1 through 4, further comprising: compressing messages of the multiple messages having a same number of occurrences of the event or a same probability of occurrence into respective messages; and transmitting each of the respective messages on the uplink channel.

Aspect 6: The method of any of aspects 1 through 5, further comprising: transmitting the at least one compressed message with one or more non-compressed messages.

Aspect 7: The method of aspect 6, wherein the one or more non-compressed messages includes particular events comprising one of all acknowledgement (ACK) feedback or all negative acknowledgement (NACK) feedback in a message responsive to a hybrid automatic repeat request (HARQ).

Aspect 8: The method of any of aspects 1 through 7, wherein the compression technique comprises a lossy encoding technique.

Aspect 9: The method of any of aspects 1 through 8, further comprising: setting the predetermined number of occurrences set equal to a value L; configuring a number of bits in a codebook used for transmitting the at least one compressed message on the uplink channel with a K number of bits; and the compression technique comprising a logarithmic compression including compressing the multiple messages with an occurrence in the communication system having the L number of occurrences into a single compressed message such that a number of bits after compression is equal to $$\log_2\left(1 + \sum_{l=0}^{L-1} \binom{l}{K}\right).$$

Aspect 10: The method of aspect 9, wherein the codebook comprises a hybrid automatic repeat request (HARQ) codebook.

Aspect 11: The method of any of aspects 1 through 8, further comprising: the compression technique utilizing a logarithmic compression, where the predetermined number of occurrences is set equal to a value L, and a number of bits in a codebook used for transmitting the at least one compressed message on the uplink channel is configured with a K number of bits; and the logarithmic compression comprises compressing messages of the multiple messages into the groups of messages such that a number of bits after compression is equal to $$\log_2\left((K - L + 1) + \sum_{l=0}^{L-1} \binom{l}{K}\right).$$

Aspect 12: The method of aspect 11, wherein the codebook comprises a hybrid automatic repeat request (HARQ) codebook.

Aspect 13: The method of any of aspects 1 through 12, further comprising:

receiving from a base station at least one indication that compressing of the multiple messages is enabled.

Aspect 14: The method of aspect 13, wherein the at least one indication is in downlink control information (DCI) transmitted in a physical downlink control channel (PDCCH).

Aspect 15: The method of aspect 13, wherein the DCI is at least one of a downlink (DL) scheduling DCI or an uplink (UL) scheduling DCI, and the uplink channel is at least one of a physical uplink control channel (PUCCH) or a physical uplink shared channel (PUSCH).

Aspect 16: The method of aspect 13, wherein the at least one indication used by the UE is a last occurring DCI transmitted prior to transmission by the UE on the uplink channel.

Aspect 17: A user equipment (UE) for use in a wireless communication system comprising: a wireless transceiver; a memory; and a processor communicatively coupled to the wireless transceiver and the memory, wherein the processor is configured to: compress multiple messages occurring in the wireless communication system into at least one compressed message using a compression technique based on a probability of occurrence of an event or based on a number of occurrences of the event, and transmit the at least one compressed message on an uplink channel.

Aspect 18: The UE of aspect 17, wherein the processor is further configured to: compress the multiple messages occurring in the wireless communication system into the at least one compressed message based on the probability of occurrence for messages of the multiple messages having a probability less than a threshold probability.

Aspect 19: The UE of aspect 17, wherein the processor is further configured to: compress the multiple messages occurring in the wireless communication system into the at least one compressed message based on the probability of occurrences of the event for messages having the probability of occurrences of the event that exceed a predetermined threshold.

Aspect 20: The UE of aspect 17, wherein the processor is further configured to: compress messages of the multiple messages having a same number of occurrences of the event or a same probability of occurrence into respective messages; and transmit each of the respective messages on the uplink channel.

Aspect 21: The UE of any of aspects 17 through 20, wherein the processor is further configured to: transmit the at least one compressed message with one or more non-compressed messages.

Aspect 22: The UE of any of aspects 17 through 21, wherein the one or more non-compressed messages includes particular events comprising one of all acknowledgement (ACK) feedback or all negative acknowledgement (NACK) feedback in a message responsive to a hybrid automatic repeat request (HARQ).

Aspect 23: A method for use in a base station in a wireless communication system, the method comprising: transmitting a signal to a user equipment (UE) in the wireless communication system; and receiving at least one compressed message on an uplink channel responsive to the signal, wherein the at least one compressed message is a compression of multiple messages to be sent by the UE in response to the signal, wherein the multiple messages that are compressed into the at least one compressed message based on a number of occurrences of an event or a probability of occurrence of the event.

Aspect 24: The method of aspect 23, wherein the signal transmitted to the UE comprises at least one hybrid automatic repeat request (HARQ) signal and the received at least one compressed message comprises a HARQ acknowledgement/non-acknowledgment (ACK/NACK) codebook.

Aspect 25: The method of either aspect 23 or aspect 24, wherein the base station is configured to: configure the UE to semi-statically perform compression of the multiple messages through sending one of radio resource control (RRC) signaling or downlink control information (DCI) to the UE; and send at least one indication to the UE that compressing of the multiple messages is enabled in the DCI, wherein the DCI comprises one of a downlink (DL) scheduling DCI or and uplink (UL) scheduling DCI, and the uplink channel comprises one of a physical uplink control channel (PUCCH) or a physical uplink shared channel (PUSCH).

Aspect 26: The method of any of aspects 23 through 25, further comprising: determining a predetermined threshold, wherein the multiple messages occurring in the wireless communication system are compressed into the at least one compressed message based on the number of occurrences of the event for messages having the number of occurrences of the event that exceed the predetermined threshold, wherein determining the predetermined threshold comprises: receiving channel state information (CSI) from the UE; and determining a value for the predetermined threshold based on the received CSI; and transmitting the predetermined threshold to the UE.

Aspect 27: A base station for use in a wireless communication system comprising: a wireless transceiver; a memory; and a processor communicatively coupled to the wireless transceiver and the memory, wherein the processor is configured to: transmit a signal to a user equipment (UE) in the wireless communication system; and receive at least one compressed message on an uplink channel responsive to the signal, wherein the at least one compressed message is a compression of multiple messages to be sent by the UE in response to the signal, wherein the multiple messages that are compressed into the at least one compressed message based on a number of occurrences of an event or a probability of occurrence of the event.

Aspect 28: The base station of aspect 27, wherein the signal transmitted to the UE comprises at least one hybrid automatic repeat request (HARQ) signal and the received at least one compressed message comprises a HARQ acknowledgement/non-acknowledgment (ACK/NACK) codebook.

Aspect 29: The base station of either of aspects 27 or 28, wherein the processor is further configured to: send downlink control information (DCI) with at least one indication to the UE that compressing of the multiple messages is enabled, wherein the DCI comprises one of a downlink (DL) scheduling DCI or and uplink (UL) scheduling DCI, and the uplink channel comprises one of a physical uplink control channel (PUCCH) or a physical uplink shared channel (PUSCH).

Aspect 30: The base station of any of aspects 27 through 29, wherein the processor is further configured to: determine a predetermined threshold, wherein the multiple messages occurring in the wireless communication system are compressed into the at least one compressed message based on the number of occurrences of the event for messages having the number of occurrences of the event that exceed the predetermined threshold, wherein determining the predetermined threshold comprises: receiving channel state information (CSI) from the UE; and determining a value for the predetermined threshold based on the received CSI; and transmit the predetermined threshold to the UE.

Aspect 31: An apparatus configured for wireless communication comprising at least one means for performing a method of any one of aspects 1 through 16 or aspects 23 through 26.

Aspect 32: A non-transitory computer-readable medium storing computer-executable code, comprising code for causing an apparatus to perform a method of any one of aspects 1 through 16 or aspects 23 through 26.

Several aspects of a wireless communication network have been presented with reference to an exemplary implementation. As those skilled in the art will readily appreciate, various aspects described throughout this disclosure may be extended to other telecommunication systems, network architectures and communication standards.

By way of example, various aspects may be implemented within other systems defined by 3GPP, such as Long-Term Evolution (LTE), the Evolved Packet System (EPS), the Universal Mobile Telecommunication System (UMTS), and/or the Global System for Mobile (GSM). Various aspects may also be extended to systems defined by the 3rd Generation Partnership Project 2 (3GPP2), such as CDMA2000 and/or Evolution-Data Optimized (EV-DO). Other examples may be implemented within systems employing IEEE 802.11 (Wi-Fi), IEEE 802.16 (WiMAX), IEEE 802.20, Ultra-Wideband (UWB), Bluetooth, and/or other suitable systems. The actual telecommunication standard, network architecture, and/or communication standard employed will depend on the specific application and the overall design constraints imposed on the system.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in FIGS. 1-13 may be rearranged and/or combined into a single component, step, feature, or function or embodied in several components, steps, or functions. Additional stages, components, steps, and/or functions may also be added without departing from novel features disclosed herein. The apparatus, devices, and/or components illustrated in FIGS. 1-13 may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present stages of the various steps in a sample order and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an stage in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b, and c. All structural and functional equivalents to the stages of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. A method for transmitting messages from a user equipment (UE) in a wireless communication system, the method comprising:
   receiving from a base station at least one indication that compressing of multiple messages is enabled,
   compressing the multiple messages occurring in the wireless communication system based on the at least one indication, wherein the multiple messages are compressed into at least one compressed message using a compression technique based on a probability of occurrence of an event or a number of occurrences of the event, and
   transmitting the at least one compressed message on an uplink channel,
   wherein the at least one indication is received in a last occurring downlink control information (DCI) of a plurality of DCI received by the UE prior to transmission by the UE on the uplink channel.

2. The method of claim 1, further comprising:
   compressing the multiple messages occurring in the wireless communication system into the at least one compressed message based on the probability of occurrence of the event having a probability less than a threshold probability.

3. The method of claim 1, further comprising:
   compressing the multiple messages occurring in the wireless communication system into the at least one compressed message based on the probability of occurrences of the event for messages having the probability of occurrences of the event that exceed a predetermined threshold.

4. The method of claim 1, further comprising:
   compressing the multiple messages occurring in the wireless communication system into the at least one compressed message based on the number of occurrences of the event for messages having the number of occurrences of the event that are less than a predetermined threshold.

5. The method of claim 1, further comprising:
   compressing messages of the multiple messages having a same number of occurrences of the event or a same probability of occurrence into respective messages; and
   transmitting each of the respective messages on the uplink channel.

6. The method of claim 1, further comprising:
   transmitting the at least one compressed message with one or more non-compressed messages.

7. The method of claim 6, wherein the one or more non-compressed messages includes particular events comprising one of all acknowledgement (ACK) feedback or all negative acknowledgement (NACK) feedback in a message responsive to a hybrid automatic repeat request (HARQ).

8. The method of claim 1, wherein the compression technique comprises a lossy encoding technique.

9. The method of claim 1, further comprising:
   setting the predetermined number of occurrences set equal to a value L;
   configuring a number of bits in a codebook used for transmitting the at least one compressed message on the uplink channel with a K number of bits; and
   the compression technique comprising a logarithmic compression including compressing the multiple messages with an occurrence in the communication system having the L number of occurrences into a single compressed message such that a number of bits after compression is equal to $$\log_2\left(1 + \sum_{l=0}^{L-1} \binom{l}{K}\right).$$

10. The method of claim 9, wherein the codebook comprises a hybrid automatic repeat request (HARQ) codebook.

11. The method of claim 1, further comprising:
    the compression technique utilizing a logarithmic compression, where the predetermined number of occurrences is set equal to a value L, and a number of bits in a codebook used for transmitting the at least one compressed message on the uplink channel is configured with a K number of bits; and
    the logarithmic compression comprises compressing messages of the multiple messages into groups of messages such that a number of bits after compression is equal to $$\log_2\left((K - L + 1) + \sum_{l=0}^{L-1} \binom{l}{K}\right).$$

12. The method of claim 11, wherein the codebook comprises a hybrid automatic repeat request (HARQ) codebook.

13. The method of claim 1, wherein the at least one indication in the last occurring DCI is received in a physical downlink control channel (PDCCH).

14. The method of claim 13, wherein the plurality of DCI comprises at least one of a downlink (DL) scheduling DCI or an uplink (UL) scheduling DCI, and the uplink channel is at least one of a physical uplink control channel (PUCCH) or a physical uplink shared channel (PUSCH).

15. A user equipment (UE) for use in a wireless communication system comprising:
    a wireless transceiver;
    a memory; and
    a processor communicatively coupled to the wireless transceiver and the memory, wherein the processor is configured to:
    receive from a base station at least one indication that compressing of multiple messages is enabled,
    compress the multiple messages occurring in the wireless communication system based on the at least one indication, wherein the multiple messages are compressed into at least one compressed message using a compression technique based on a probability of occurrence of an event or based on a number of occurrences of the event, and
    transmit the at least one compressed message on an uplink channel,
    wherein the at least one indication is received in a last occurring downlink control information (DCI) of a plurality of DCI received by the UE prior to transmission by the UE on the uplink channel.

16. The UE of claim 15, wherein the processor is further configured to:
    transmit the at least one compressed message with one or more non-compressed messages.

17. The UE of claim 16, wherein the one or more non-compressed messages includes particular events comprising one of all acknowledgement (ACK) feedback or all negative acknowledgement (NACK) feedback in a message responsive to a hybrid automatic repeat request (HARQ).

18. The UE of claim 15, wherein the processor is further configured to:
compress the multiple messages occurring in the wireless communication system into the at least one compressed message based on the probability of occurrence for messages of the multiple messages having a probability less than a threshold probability.

19. The UE of claim 15, wherein the processor is further configured to:
compress the multiple messages occurring in the wireless communication system into the at least one compressed message based on the probability of occurrences of the event for messages having the probability of occurrences of the event that exceed a predetermined threshold.

20. The UE of claim 15, wherein the processor is further configured to:
compress messages of the multiple messages having a same number of occurrences of the event or a same probability of occurrence into respective messages; and
transmit each of the respective messages on the uplink channel.

21. A method for use in a base station in a wireless communication system, the method comprising:
sending at least one indication to a user equipment (UE) in the wireless communication system that compressing of multiple messages is enabled;
transmitting a signal to the UE; and
receiving at least one compressed message on an uplink channel responsive to the signal and based on the at least one indication, wherein the at least one compressed message is a compression of multiple messages to be sent by the UE in response to the signal, wherein the multiple messages are compressed into the at least one compressed message based on a number of occurrences of an event or a probability of occurrence of the event, and wherein the at least one indication is sent in a last occurring downlink control information (DCI) of a plurality of DCI sent to the UE prior to receiving the at least one compressed message on the uplink channel.

22. The method of claim 21, wherein the signal transmitted to the UE comprises at least one hybrid automatic repeat request (HARQ) signal and the received at least one compressed message comprises a HARQ acknowledgement/non-acknowledgment (ACK/NACK) codebook.

23. The method of claim 21, further comprising:
configuring the UE to semi-statically perform compression of the multiple messages through sending one of radio resource control (RRC) signaling or the plurality of DCI to the UE; and
wherein the plurality of DCI comprises at least one of a downlink (DL) scheduling DCI or an uplink (UL) scheduling DCI, and the uplink channel comprises one of a physical uplink control channel (PUCCH) or a physical uplink shared channel (PUSCH).

24. The method of claim 21, further comprising:
determining a predetermined threshold, wherein the multiple messages occurring in the wireless communication system are compressed into the at least one compressed message based on the number of occurrences of the event for messages having the number of occurrences of the event that exceed the predetermined threshold, wherein determining the predetermined threshold comprises:
receiving channel state information (CSI) from the UE; and
determining a value for the predetermined threshold based on the received CSI; and
transmitting the predetermined threshold to the UE.

25. A base station for use in a wireless communication system comprising:
a wireless transceiver;
a memory; and
a processor communicatively coupled to the wireless transceiver and the memory, wherein the processor is configured to:
send at least one indication to a user equipment (UE) in the wireless communication system that compressing of multiple messages is enabled;
transmit a signal to the UE; and
receive at least one compressed message on an uplink channel responsive to the signal and based on the at least one indication, wherein the at least one compressed message is a compression of multiple messages to be sent by the UE in response to the signal, wherein the multiple messages are compressed into the at least one compressed message based on a number of occurrences of an event or a probability of occurrence of the event, and wherein the at least one indication is sent in a last occurring downlink control information (DCI) of a plurality of DCI sent to the UE prior to receiving the at least one compressed message on the uplink channel.

26. The base station of claim 25, wherein the processor is further configured to:
determine a predetermined threshold, wherein the multiple messages occurring in the wireless communication system are compressed into the at least one compressed message based on the number of occurrences of the event for messages having the number of occurrences of the event that exceed the predetermined threshold, wherein the processor configured to determine the predetermined threshold is configured to:
receive channel state information (CSI) from the UE; and
determine a value for the predetermined threshold based on the received CSI; and
transmit the predetermined threshold to the UE.

27. The base station of claim 25,
wherein the plurality of DCI comprises at least one of a downlink (DL) scheduling DCI or an uplink (UL) scheduling DCI, and the uplink channel comprises one of a physical uplink control channel (PUCCH) or a physical uplink shared channel (PUSCH).

28. The base station of claim 25, wherein the signal transmitted to the UE comprises at least one hybrid automatic repeat request (HARQ) signal and the received at least one compressed message comprises a HARQ acknowledgement/non-acknowledgment (ACK/NACK) codebook.

* * * * *